United States Patent
Mochiki et al.

(10) Patent No.: US 10,291,149 B2
(45) Date of Patent: May 14, 2019

(54) POWER CONVERTER FOR REDUCING A DIFFERENCE BETWEEN REFERENCE POTENTIALS OF SEMICONDUCTOR DEVICES THAT ARE SIMULTANEOUSLY TURNED ON AND OFF

(71) Applicant: DENSO CORPORATION, Kariya, Aichi-pref. (JP)

(72) Inventors: Kengo Mochiki, Kariya (JP); Yuu Yamahira, Kariya (JP); Tomohisa Sano, Kariya (JP); Yohei Kondo, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/065,876

(22) PCT Filed: Nov. 4, 2016

(86) PCT No.: PCT/JP2016/082866
§ 371 (c)(1),
(2) Date: Jun. 25, 2018

(87) PCT Pub. No.: WO2017/110266
PCT Pub. Date: Jun. 29, 2017

(65) Prior Publication Data
US 2019/0013744 A1 Jan. 10, 2019

(30) Foreign Application Priority Data

Dec. 25, 2015 (JP) .................................. 2015-254463

(51) Int. Cl.
| | | |
|---|---|---|
| H02M 7/5387 | (2007.01) | |
| H01L 23/367 | (2006.01) | |
| H02P 27/06 | (2006.01) | |
| H02M 7/00 | (2006.01) | |

(52) U.S. Cl.
CPC ........ *H02M 7/5387* (2013.01); *H01L 23/367* (2013.01); *H02M 7/003* (2013.01); *H02P 27/06* (2013.01)

(58) Field of Classification Search
None
See application file for complete search history.

(56) References Cited

FOREIGN PATENT DOCUMENTS

JP       2015-139299 A       7/2015

*Primary Examiner* — Henry E Lee, III
(74) *Attorney, Agent, or Firm* — Oliff PLC

(57) ABSTRACT

A power converter is provided with semiconductor devices, a capacitor, a positive bus bar, and a negative bus bar. The negative bus bar includes a negative side body and a plurality of negative side branches. The negative side branches include an interposed negative side branch interposed between two positive side branches connected to the upper arm semiconductor devices that belong to the same semiconductor device group as the lower arm semiconductor devices connected to the negative side branches, and include an end negative side branch that is not interposed between two positive side branches. The self-inductance of the end negative side branch is smaller than the self-inductance of the interposed negative side branch.

10 Claims, 23 Drawing Sheets

POWER CONVERTER FOR REDUCING A DIFFERENCE BETWEEN REFERENCE POTENTIALS OF SEMICONDUCTOR DEVICES THAT ARE SIMULTANEOUSLY TURNED ON AND OFF

CROSS-REFERENCE TO RELATED APPLICATION

This application is the U.S. national phase of International Application No. PCT/JP2016/082866 filed Nov. 4, 2016 which designated the U.S. and claims priority to Japanese Patent Application No. 2015-254463 filed Dec. 25, 2015, the description of which is incorporated herein by reference.

TECHNICAL FIELD

The present disclosure relates to a power converter including a plurality of semiconductor devices, a smoothing capacitor, and positive and negative bus bars electrically connecting them.

BACKGROUND ART

Some known power converters such as inverters and DC-DC converters include semiconductor devices such as IGBTs, a smoothing capacitor, and positive and negative bus bars electrically connecting them (refer to PTL 1 below).

The positive bus bar includes a positive side body connected to the capacitor and a plurality of positive side branches extending from the positive side body and connected to semiconductor devices. The negative bus bar includes a negative side body connected to the capacitor and a plurality of negative side branches extending from the negative side body and connected to semiconductor devices. The positive side branches and the negative side branches are arranged alternately. Therefore, the positive side branches and the negative side branches are close to each other, which reduces the parasitic inductances of the branches.

Power converters that have been recently developed can simultaneously turn on and off a plurality of parallel-connected semiconductor devices so as to produce a high output current as a whole even when only a low current flows through the individual semiconductor devices.

CITATION LIST

Patent Literature

[PTL 1] JP 2015-139299 A

SUMMARY OF THE INVENTION

However, the inventors have found through their detailed study that the following problem occurs if positive side branches and negative side branches are arranged alternately and if a plurality of semiconductor devices is simultaneously turned on and off.

Specifically, mutual and self-inductances are parasitic in each negative side branch. If positive side branches and negative side branches are arranged alternately and if a plurality of semiconductor devices connected to the branches are simultaneously turned on and off, effective inductances, i.e., the sum of mutual and self-inductances, can differ greatly between the negative side branches, as described later. Therefore, induced electromotive forces generated due to the effective inductances when current flows can differ greatly between the negative side branches. Thus, the electrical potentials (that is, reference potentials) of the reference electrodes such as emitters can differ greatly between the plurality of semiconductor devices that are electrically connected to the negative side branches and simultaneously turned on and off. Therefore, as described later, high voltages may be locally applied to the control terminals of some semiconductor devices.

An object of the present disclosure is to provide a power converter capable of reducing the difference between the reference potentials of a plurality of semiconductor devices that is simultaneously turned on and off.

A first aspect of the present disclosure is a power converter including: semiconductor devices including a plurality of upper arm semiconductor devices and a plurality of lower arm semiconductor devices connected in series;

freewheeling diodes connected in inverse parallel with respective semiconductor devices;

a capacitor that smooths a DC voltage;

a positive bus bar having a positive side body electrically connected to the capacitor and a plurality of positive side branches extending from the positive side body and electrically connected to the upper arm semiconductor devices; and a negative bus bar having a negative side body electrically connected to the capacitor and a plurality of negative side branches extending from the negative side body and electrically connected to the lower arm semiconductor devices, wherein the positive side branches and the negative side branches are arranged alternately, two or more of the upper arm semiconductor devices that are simultaneously turned on and off and two or more of the lower arm semiconductor devices that are connected in series with the upper arm semiconductor devices and simultaneously turned on and off constitute a semiconductor device group, the negative side branches include an interposed negative side branch interposed between two of the positive side branches connected to the upper arm semiconductor devices that belong to the same semiconductor device group as the lower arm semiconductor devices connected to the negative side branches, and include an end negative side branch that is not interposed between two positive side branches, and a self-inductance of the end negative side branch is smaller than a self-inductance of the interposed negative side branch.

Effect of the Invention

In the power converter, the positive side branches and the negative side branches are arranged alternately, and a plurality of semiconductor devices that are connected to these branches and simultaneously turned on and off constitutes a semiconductor device group. The self-inductance of the end negative side branch of the plurality of negative side branches is smaller than that of the interposed negative side branch.

Therefore, the difference between the reference potentials of the plurality of semiconductor devices that is simultaneously turned on and off can be reduced. Specifically, since the end negative side branch is not interposed between two positive side branches, as described later, the end negative side branch is likely to have a larger mutual inductance than the interposed negative side branch interposed between two positive side branches. In the present aspect, the end negative side branch that is likely to have a large mutual inductance is configured to have a smaller self-inductance than the interposed negative side branch. Therefore, the difference between the effective inductances (i.e., the sum of mutual and self-inductances) of the interposed negative side branch and the end negative side branch can be reduced. Therefore, induced electromotive forces generated due to the effective inductances when current flows do not differ greatly between the interposed negative side branch and the end negative side branch. Thus, the difference between the reference potential of the semiconductor device electrically connected to the interposed negative side branch and the reference potential of the semiconductor device electrically connected to the end negative side branch can be reduced. In other words, the difference between the reference potentials of the plurality of semiconductor devices that is connected to these negative side branches and simultaneously turned on and off can be reduced. Therefore, it is possible to prevent the defect of local application of high voltages to the control terminals of some semiconductor devices.

As described above, the above aspect can provide a power converter capable of reducing the difference between the reference potentials of a plurality of semiconductor devices that is simultaneously turned on and off.

BRIEF DESCRIPTION OF DRAWINGS

The above and other objects, characteristics, and advantages of the present disclosure will be further clarified in the following detailed description with reference to the accompanying drawings, in which:

FIG. 9 is a partial circuit diagram illustrating the power converter according to the first embodiment when the upper arm semiconductor devices are turned on;

DESCRIPTION OF EMBODIMENTS

The power converters can be in-vehicle power converters to be mounted on vehicles such as electric cars and hybrid vehicles.

First Embodiment

Figure 1:
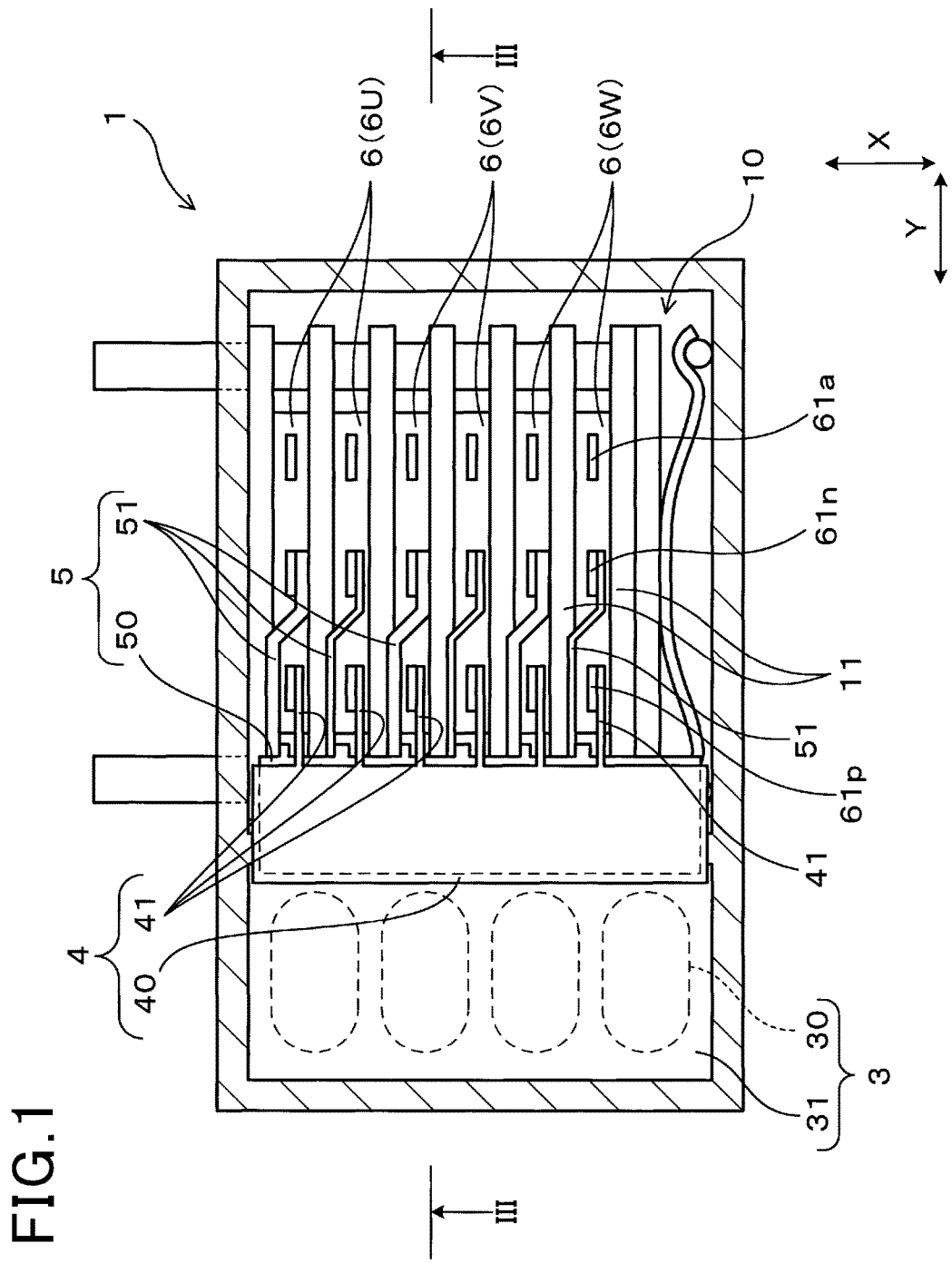
FIG. 1 is a cross-sectional view illustrating a power converter according to a first embodiment, and is taken along a line I-I of FIG. 3.
Figure 2:
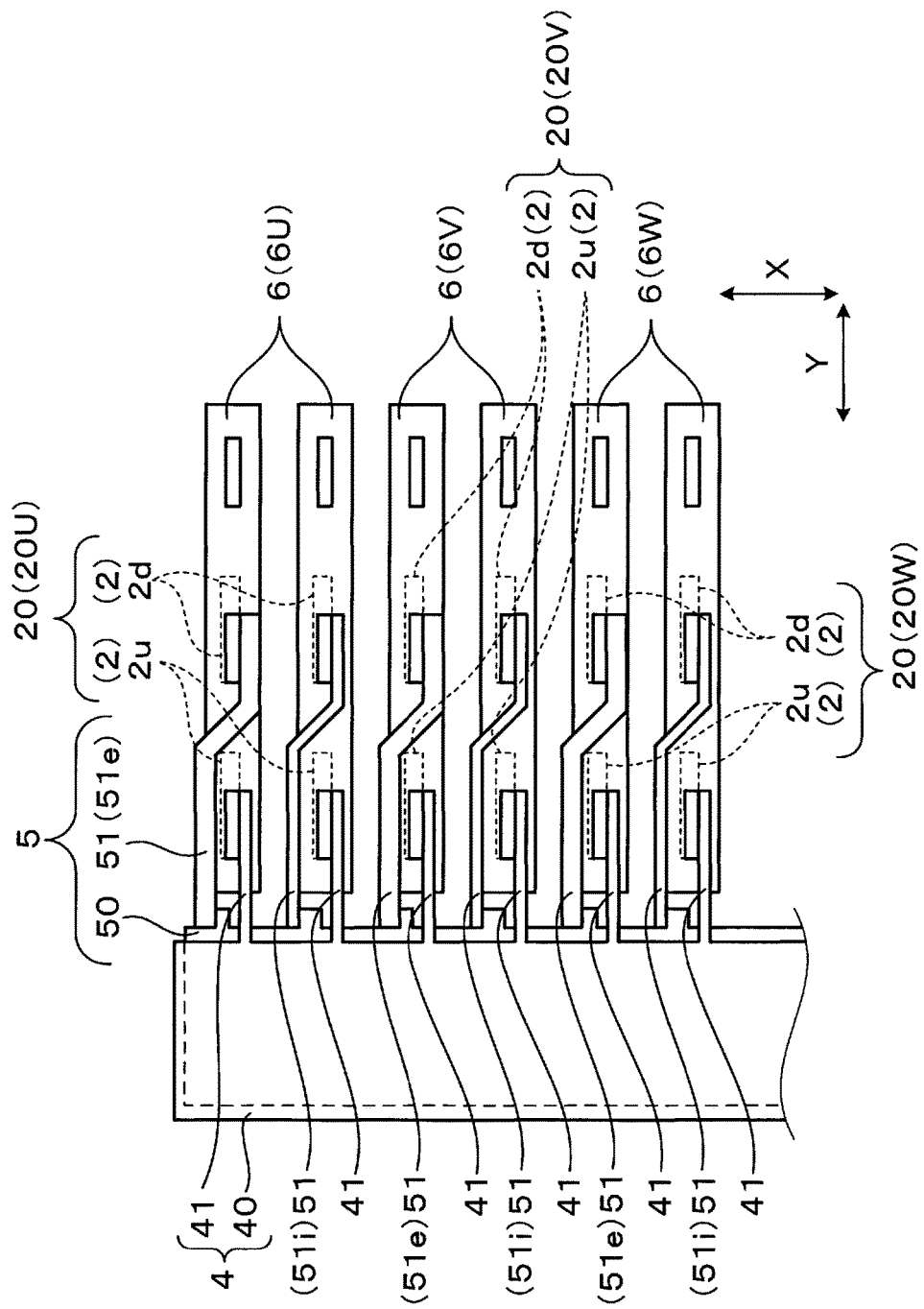
FIG. 2 is a partial cross-sectional view illustrating the power converter according to the first embodiment.

An embodiment of the power converter will be described with reference to FIGS. 1 to 11. As illustrated in FIGS. 1 and 2, the power converter 1 according to the present embodiment includes an upper arm semiconductor device 2u, a lower arm semiconductor device 2d, a capacitor 3, a positive bus bar 4, and a negative bus bar 5.

Figure 7:
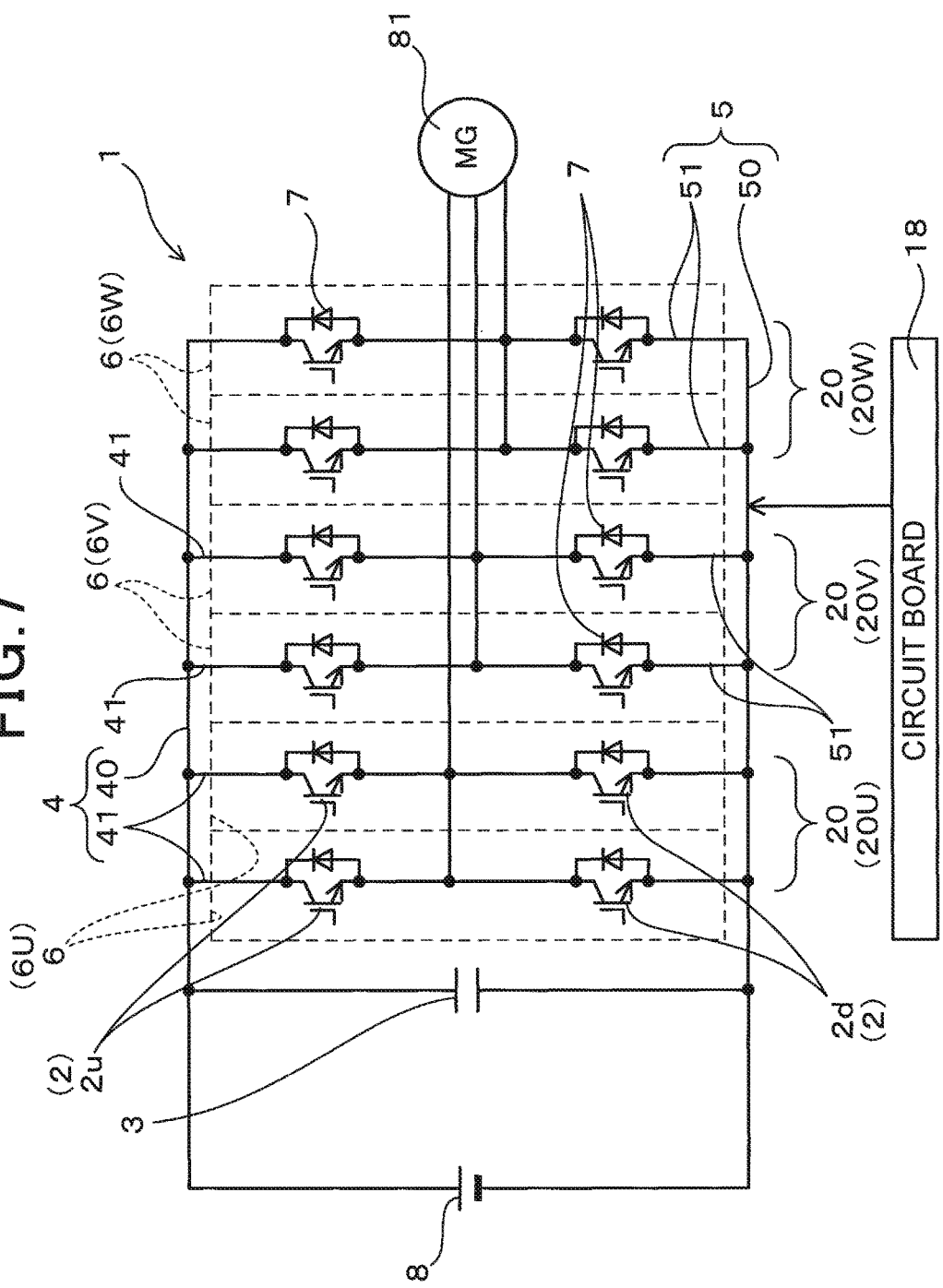
FIG. 7 is a circuit diagram illustrating the power converter according to the first embodiment.

As illustrated in FIG. 7, the upper arm semiconductor device 2u and the lower arm semiconductor device 2d are connected in series. A plurality of upper arm semiconductor devices 2u and a plurality of lower arm semiconductor devices 2d are provided. A freewheeling diode 7 is connected in inverse parallel with each of the upper arm semiconductor devices 2u and the lower arm semiconductor devices 2d.

The capacitor 3 smooths a DC voltage of a DC power source 8.

Figure 3:
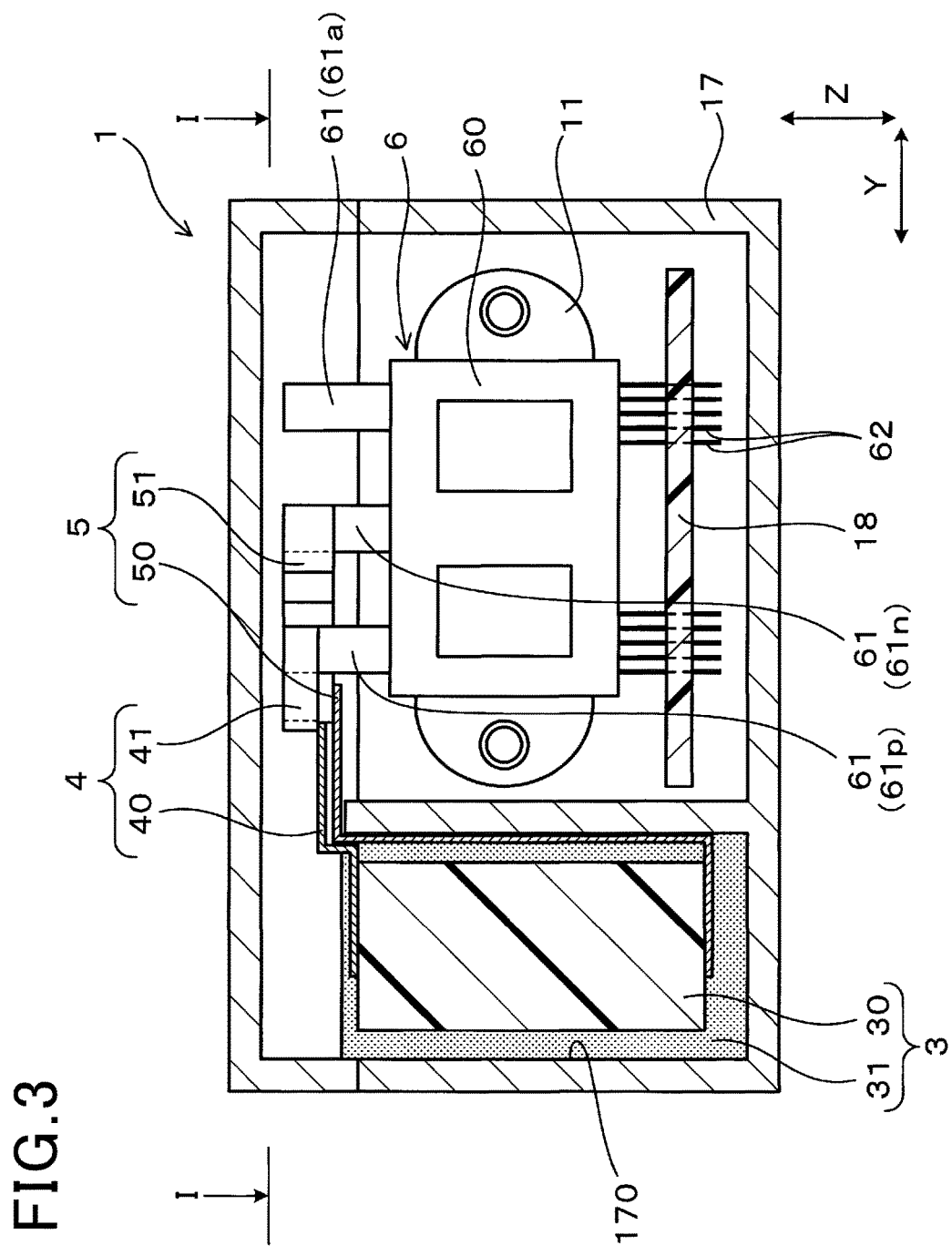
FIG. 3 is a cross-sectional view taken along a line of FIG. 1.
Figure 4:
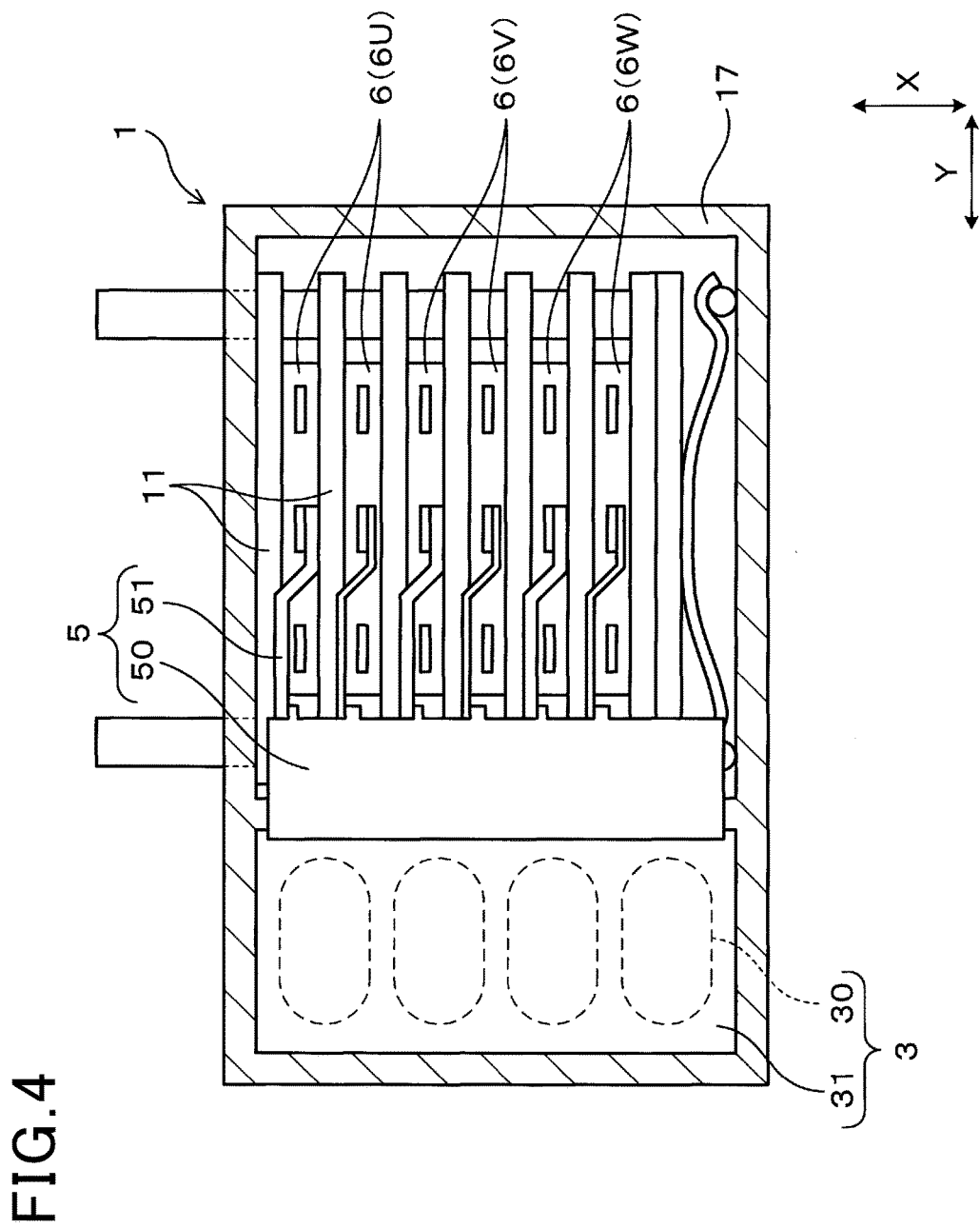
FIG. 4 is a cross-sectional view illustrating the power converter without a positive bus bar according to the first embodiment.

As illustrated in FIGS. 2 and 3, the positive bus bar 4 includes a positive side body 40 and a plurality of positive side branches 41. The positive side body 40 is electrically connected to the capacitor 3. Each of the positive side branches 41 extends from the positive side body 40 to be electrically connected to the corresponding one of the upper arm semiconductor devices 2u.

The negative bus bar 5 includes a negative side body 50 and a plurality of negative side branches 51. The negative side body 50 is electrically connected to the capacitor 3. Each of the negative side branches 51 extends from the negative side body 50 to be electrically connected to the corresponding one of the lower arm semiconductor devices 2d.

As illustrated in FIG. 2, the positive side branches 41 and the negative side branches 51 are arranged alternately. As illustrated in FIGS. 2 and 7, a plurality of upper arm semiconductor devices 2u that is simultaneously turned on and off and a plurality of lower arm semiconductor devices 2d that is connected in series with the upper arm semiconductor devices 2u and simultaneously turned on and off constitute a semiconductor device group 20, and a plurality of semiconductor device groups 20 are formed.

As illustrated in FIG. 2, the negative side branches 51 include an interposed negative side branch 51i interposed between two positive side branches 41 connected to the upper arm semiconductor devices 2u that belong to the same semiconductor device group 20 as the lower arm semiconductor devices 2d connected to the negative side branches 51, and include an end negative side branch 51e that is not interposed between two positive side branches.

The self-inductance of the end negative side branch 51e is set to be smaller than the self-inductance of the interposed negative side branch 51i.

The power converter 1 according to the present embodiment is an in-vehicle power converter to be mounted on a vehicle such as an electric car and a hybrid vehicle.

As illustrated in FIG. 7, the power converter 1 is connected to the DC power source 8 and a three-phase AC motor 81. The power converter 1 is configured to turn on and off the individual semiconductor devices 2 to convert DC power supplied from the DC power source 8 into AC power. The power converter 1 then drives the three-phase AC motor 81 using the obtained AC power to operate the vehicle.

One upper arm semiconductor device 2u and one lower arm semiconductor device 2d are sealed in a body 60 (refer to FIG. 3) of a semiconductor module 6. As described above, in the present embodiment, a plurality of semiconductor devices 2 are simultaneously turned on and off. Consequently, the power converter 1 produces a high output current as a whole even when only a low current flows through the individual semiconductor devices 2.

The upper arm semiconductor devices 2u are electrically connected to the positive side branches 41 (refer to FIG. 2) of the positive bus bar 4. The lower arm semiconductor devices 2d are electrically connected to the negative side branches 51 of the negative bus bar 5.

As described above, in the present embodiment, the plurality of upper arm semiconductor devices 2u that are simultaneously turned on and off and the plurality of lower arm semiconductor devices 2d that are connected in series with the upper arm semiconductor devices 2u and simultaneously turned on and off constitute the semiconductor device group 20. Semiconductor device groups 20 include a U-phase semiconductor device group 20U, a V-phase semiconductor device group 20V, and a W-phase semiconductor device group 20W.

Figure 8:
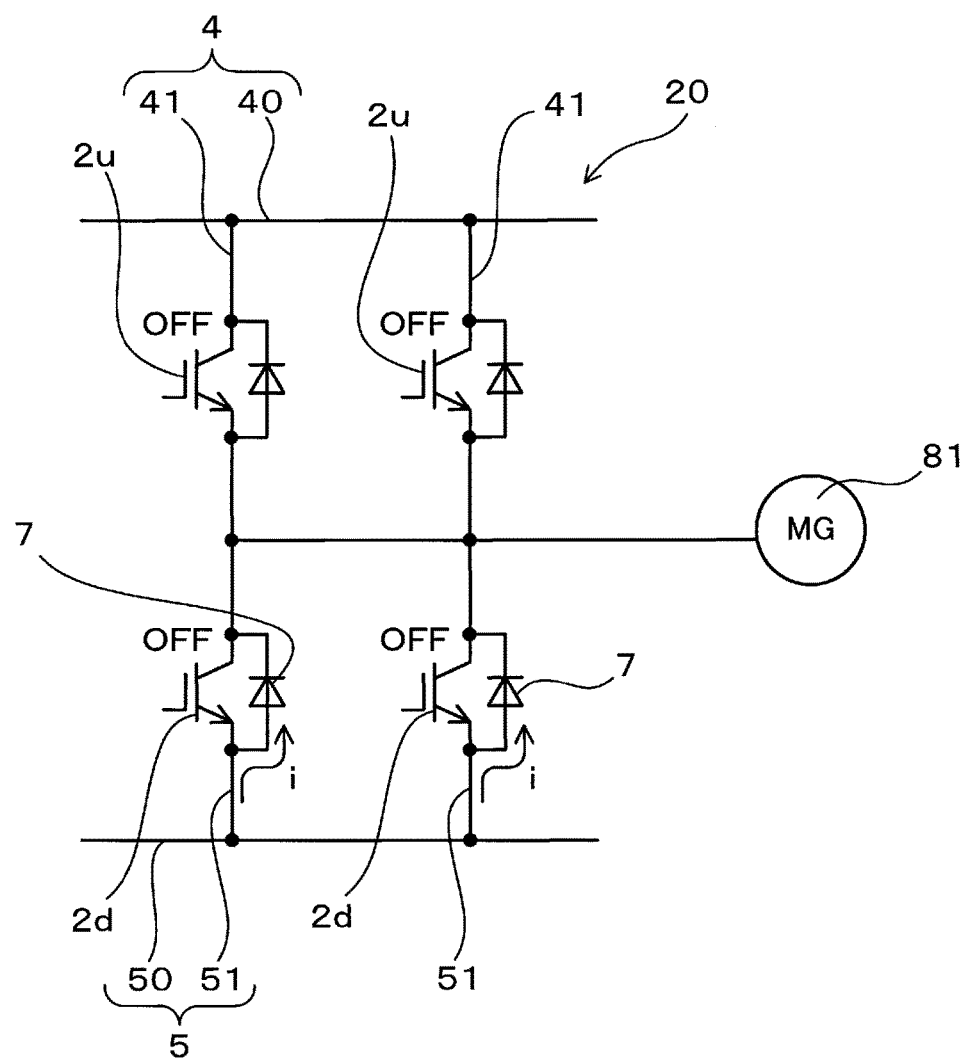
FIG. 8 is a partial circuit diagram illustrating the power converter according to the first embodiment when upper arm semiconductor devices are turned off.
Figure 9:
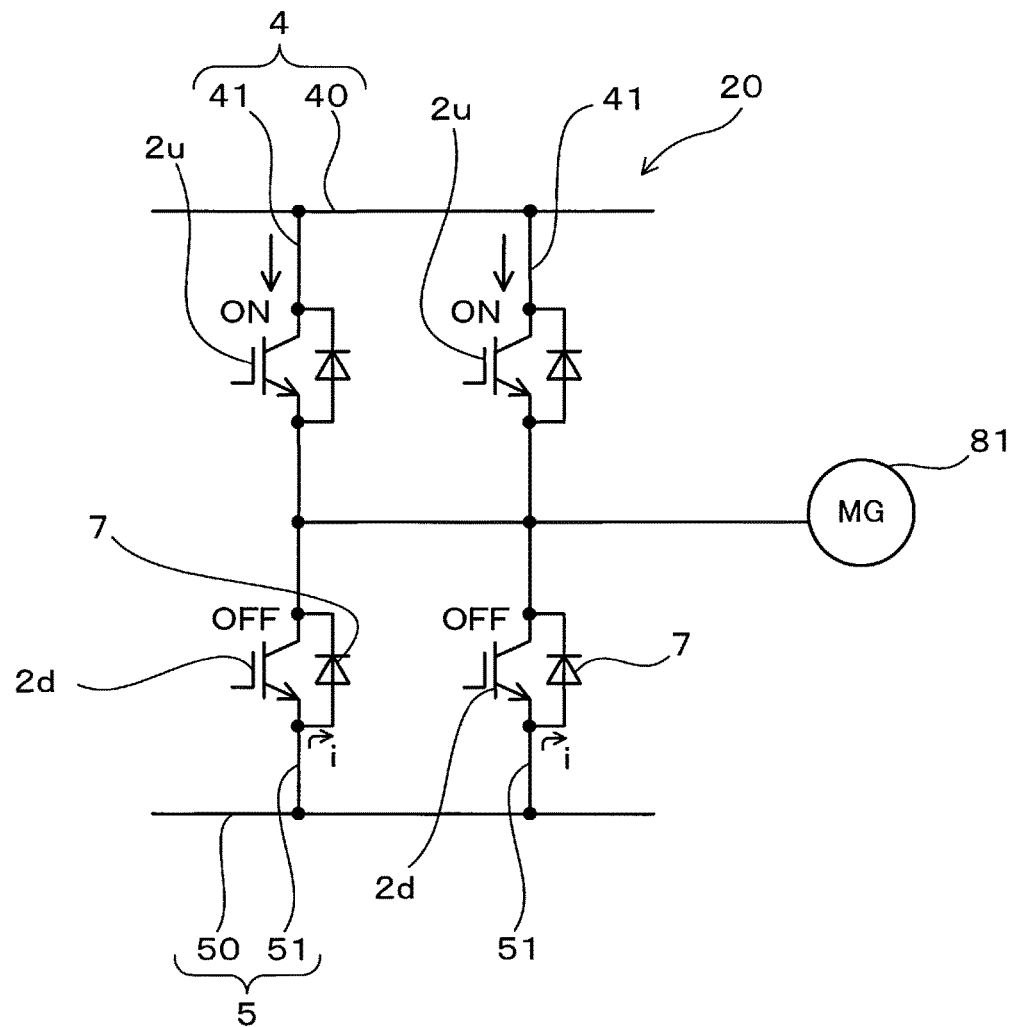

Next, the reason why the mutual inductance of the interposed negative side branch 51i is smaller than that of the end negative side branch 51e will be described. Suppose all the semiconductor devices 2 (2u and 2d) constituting the semiconductor device group 20 are off as illustrated in FIG. 8, and then the upper arm semiconductor devices 2u are turned on as illustrated in FIG. 9. As illustrated in FIG. 8, while the upper arm semiconductor devices 2u are off, freewheeling current i flows through the freewheeling diodes 7 connected in inverse parallel with the lower arm semiconductor devices 2d by the action of the three-phase AC motor 81 that is an inductive load. Freewheeling current i flows through the negative side branches 51. After that, the upper arm semiconductor devices 2u are turned on as illustrated in FIG. 9, and current i flowing through the upper arm semiconductor devices 2u gradually increases. Specifically, current i flowing through the positive side branches 41 gradually increases. Meanwhile, since the freewheeling diodes 7 of the lower arm semiconductor devices 2d are reversely biased, freewheeling current i gradually decreases.

Figure 10:
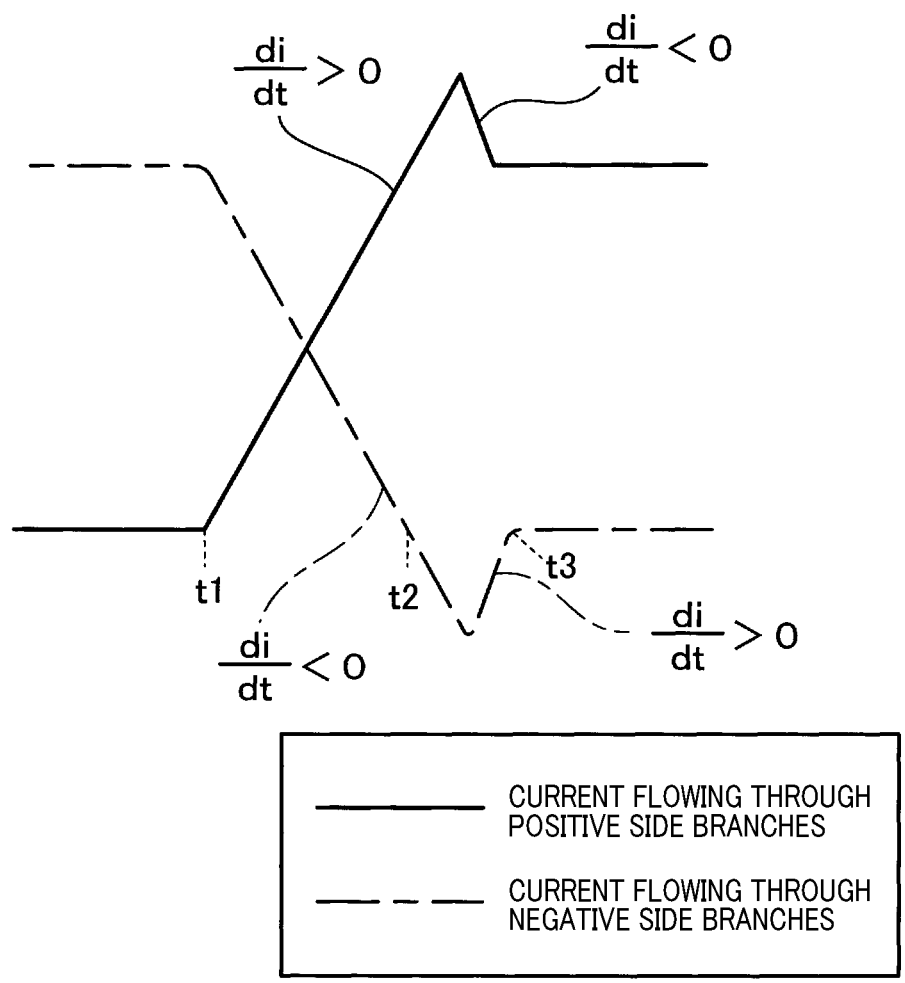
FIG. 10 is a graph representing fluctuations of currents flowing through positive side branches and negative side branches which occur when the upper arm semiconductor devices are turned on, according to the first embodiment.

FIG. 10 is a diagram illustrating temporal fluctuations of currents i flowing through the positive side branches 41 and the negative side branches 51. As illustrated in this figure, the upper arm semiconductor devices 2u are turned on at time t1, and current i flowing through the positive side branches 41 gradually increases. Meanwhile, current i (namely, freewheeling current) flowing through the negative side branches 51 gradually decreases. At time t2, current i flowing through the negative side branches 51 reaches zero. After that, until time t3, a recovery current flows through the freewheeling diodes 7, and the recovery current flows into the negative side branches 51.

As illustrated in FIG. 10, the temporal fluctuation rate di/dt of current i flowing through the positive side branches 41 and the temporal fluctuation rate di/dt of current i flowing through the negative side branches 51 are opposite to each other. Therefore, the interposed negative side branch 51i (refer to FIG. 2) interposed between two positive side branches 41 is more easily magnetically coupled to the positive side branches 41 than the end negative side branch 51e that is only adjacent to a single positive side branch 41 is. This is why the mutual inductance of the interposed negative side branch 51i is smaller than that of the end negative side branch 51e.

Figure 6:
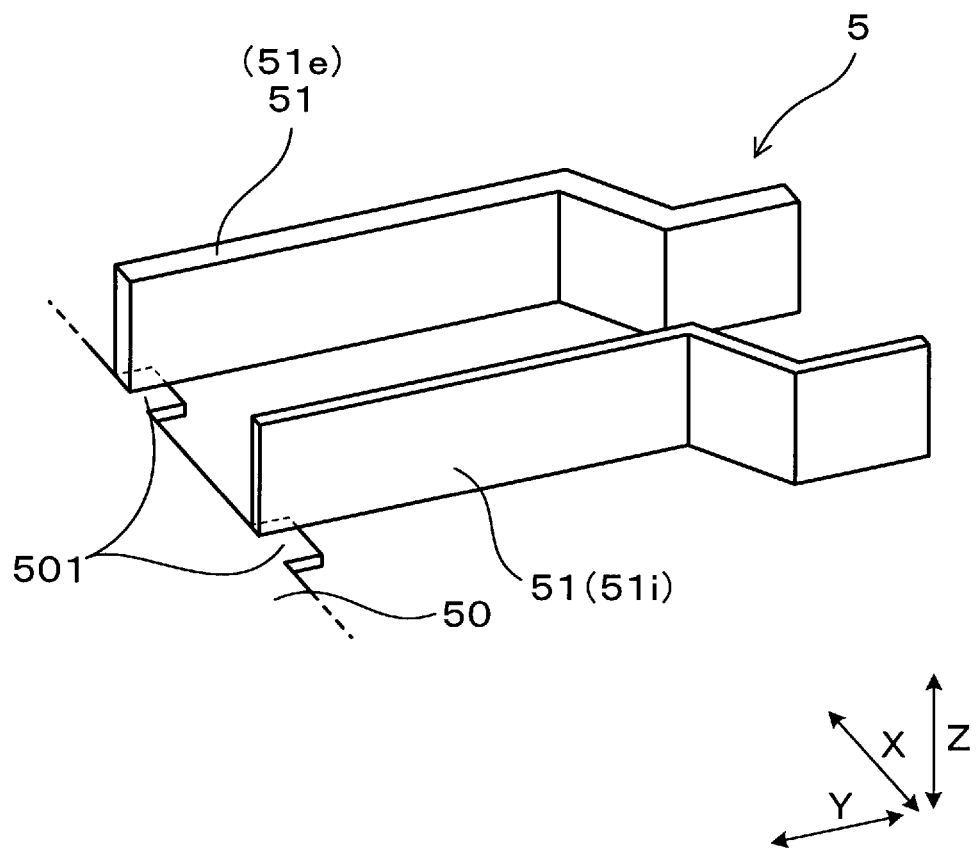
FIG. 6 is an enlarged perspective view illustrating a main part of the negative bus bar according to the first embodiment.

Next, the structure of the negative bus bar 5 will be described. As illustrated in FIG. 6, the negative bus bar includes the negative side body 50 and the plurality of negative side branches 51 extending from the negative side body 50. The negative side body 50 is provided with comb teeth 501. The negative side branches 51 extend from the comb teeth 501. The end negative side branch 51e is thicker than the interposed negative side branch 51i. The end negative side branch 51e can be formed, for example, by welding a metal plate thicker than the interposed negative side branch 51i to the comb tooth 501. The interposed negative side branch 51i includes the same plate-like member as the negative side body 50. Specifically, the negative side body 50 and the interposed negative side branch 51i are formed by bending a single plate-like member.

As illustrated in FIGS. 2 and 3, the structure of the positive bus bar 4 is similar to that of the negative bus bar 5. The positive bus bar 4 includes the plate-like positive side body 40 and the plurality of positive side branches 41 extending from the positive side body 40. In the present embodiment, all the positive side branches 41 are equal in thickness.

As illustrated in FIGS. 2 and 3, the positive side body 40 and the negative side body 50 overlap each other. An extending direction (hereinafter also referred to as the Y direction) in which the negative side branches 51 extend from the negative side body 50 coincides with the direction in which the positive side branches 41 extend from the positive side body 40. The positive side branches 41 and the negative side branches 51 are arrayed in an array direction (hereinafter also referred to as the X direction) orthogonal to the Y direction. As illustrated in FIG. 3, the positive side branches 41 and the negative side branches 51 overlap each other when viewed in the X direction.

The positive bus bar 4 and the negative bus bar 5 are connected to the capacitor 3. The capacitor 3 includes a capacitor element 30 and a sealing member 31 that seals the capacitor element 30.

As illustrated in FIG. 3, the semiconductor module 6 includes the body 60 that seals the semiconductor devices 2, power terminals 61 projecting from the body 60, and control terminals 62. The power terminals 61 include a positive terminal 61p connected to the positive bus bar 4, a negative terminal 61n connected to the negative bus bar 5, and an AC terminal 61a connected to the three-phase AC motor 81 (refer to FIG. 7). The control terminals 62 are connected to a control circuit board 18. The on/off operation of the semiconductor devices 2 is controlled by the control circuit board 18.

Figure 5:
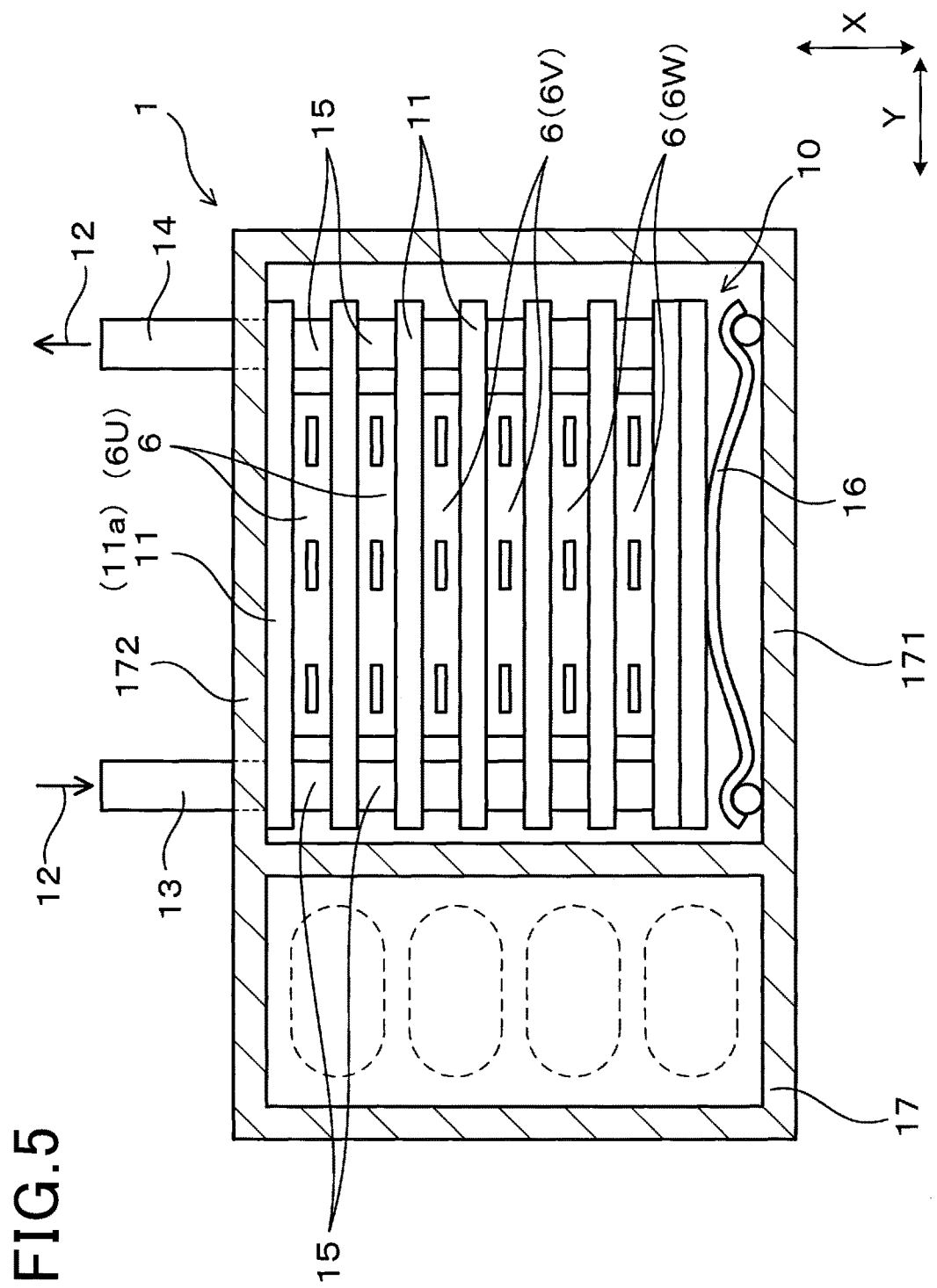
FIG. 5 is a cross-sectional view illustrating the power converter without positive and negative bus bars according to the first embodiment.

As illustrated in FIG. 5, in the present embodiment, a plurality of semiconductor modules 6 and a plurality of cooling pipes 11 that cool the semiconductor modules 6 are alternately stacked to constitute a stacked body 10. Two adjacent cooling pipes 11 are coupled by two coupling pipes 15. The coupling pipes 15 are provided at the Y-directional opposite ends of the cooling pipes 11.

An end cooling pipe 11a of the plurality of cooling pipes 11 located at one end in the array direction of the positive side branches 41 and the negative side branches (namely, X direction: refer to FIG. 2) is equipped with an inlet pipe 13 for introducing a refrigerant 12 and an outlet pipe 14 for discharging the refrigerant 12. Once the refrigerant 12 is introduced through the inlet pipe 13, the refrigerant 12 passes through the coupling pipes 15 and flows through all the cooling pipes 11 to be discharged through the outlet pipe 14. The semiconductor modules 6 are configured to be cooled in this manner.

A pressurizing member 16 (e.g., plate spring) is arranged between a first wall 171 of a case 17 and the stacked body 10. The pressurizing member 16 presses the stacked body 10 against a second wall 172 of the case 17. Consequently, contact pressure between the cooling pipes 11 and the semiconductor modules 6 is secured, and the stacked body 10 is fixed inside the case 17.

Figure 21:
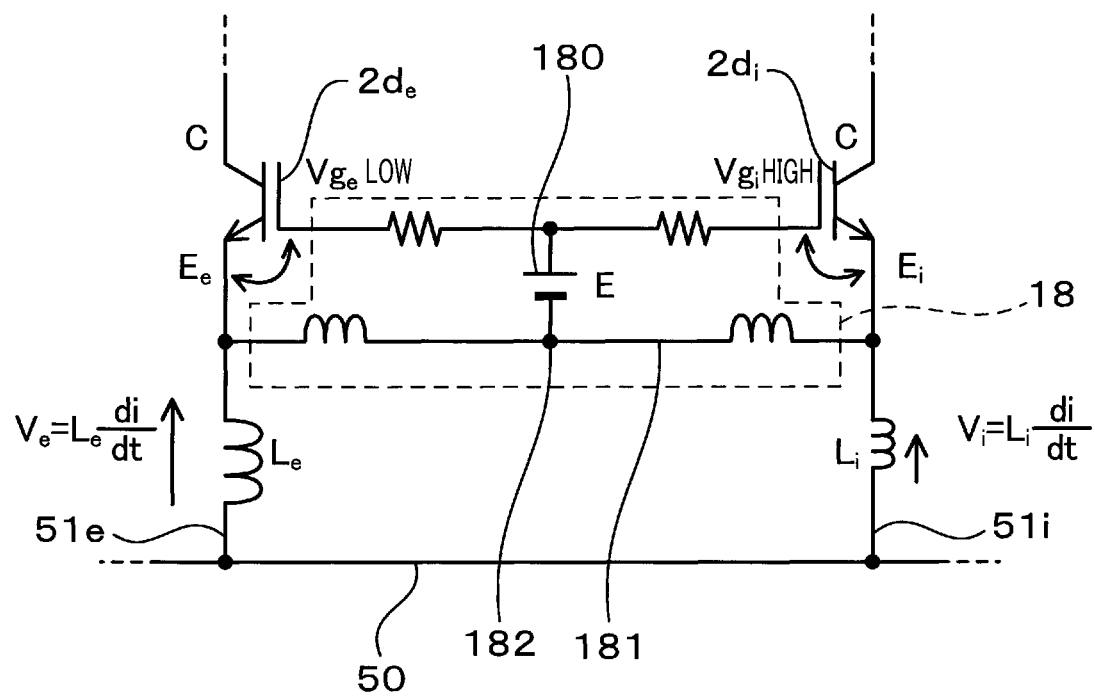
FIG. 21 is a partial circuit diagram illustrating a power converter according to a first comparative example.

Below is the reason why a great difference between the effective inductances of the end negative side branch 51e and the interposed negative side branch 51i can cause a great difference between the reference potentials of the lower arm semiconductor devices 2d connected to the negative side branches 51e and 51i. FIG. 21 is a partial circuit of a conventional power converter. As illustrated in this figure, conventionally, the effective inductance $L_e$ of the end negative side branch 51e is larger than the effective inductance $L_i$ of the interposed negative side branch 51i. Specifically, since the mutual inductance of the end negative side branch 51e is larger than that of the interposed negative side branch 51i whereas the self-inductances of the negative side branches 51e and 51i are almost the same, the effective inductance of the end negative side branch 51e is larger than that of the interposed negative side branch 51i. Gate terminals of the two lower arm semiconductor devices $2d_e$ and $2d_i$ are connected on the control circuit board 18. The control circuit board 18 is provided with a line 181 connecting emitter terminals $E_e$ and $E_i$ of the two lower arm semiconductor devices $2d_e$ and $2d_i$. A power circuit 180 is provided between the line 181 and the gate terminals.

Suppose the two lower arm semiconductor devices $2d_e$ and $2d_i$ are simultaneously turned on. Since the effective inductance $L_e$ of the end negative side branch 51e is large as described above, a relatively large induced electromotive force $V_e$ ($=L_e di/dt$) is generated by the effective inductance $L_e$ at the time that current i starts to flow. In contrast, since the effective inductance $L_i$ of the interposed negative side branch 51i is small, a small induced electromotive force $V_i$ ($=L_i di/dt$) is generated. Therefore, the electric potential of the emitter terminal $E_e$ connected to the end negative side branch 51e is higher than the electric potential of the emitter terminal $E_i$ connected to the interposed negative side branch 51i.

As described above, when the electrical potentials (that is, reference potentials) of the emitter terminals (that is, reference electrodes) of the lower arm semiconductor device $2d_e$ connected to the end negative side branch 51e and the lower arm semiconductor device $2d_i$ connected to the interposed negative side branch 51i are greatly different, a high voltage may be locally applied between the emitter and gate terminals of the semiconductor device $2d_i$.

In contrast, the difference between the effective inductances L of the two negative side branches 51e and 51i can be reduced if the self-inductance of the end negative side branch 51e is reduced as in the present embodiment. Therefore, it is possible to prevent the lower arm semiconductor device $2d_e$ connected to the end negative side branch 51e and the lower arm semiconductor device $2d_i$ connected to the interposed negative side branch 51i from differing greatly in reference potential.

Figure 23:
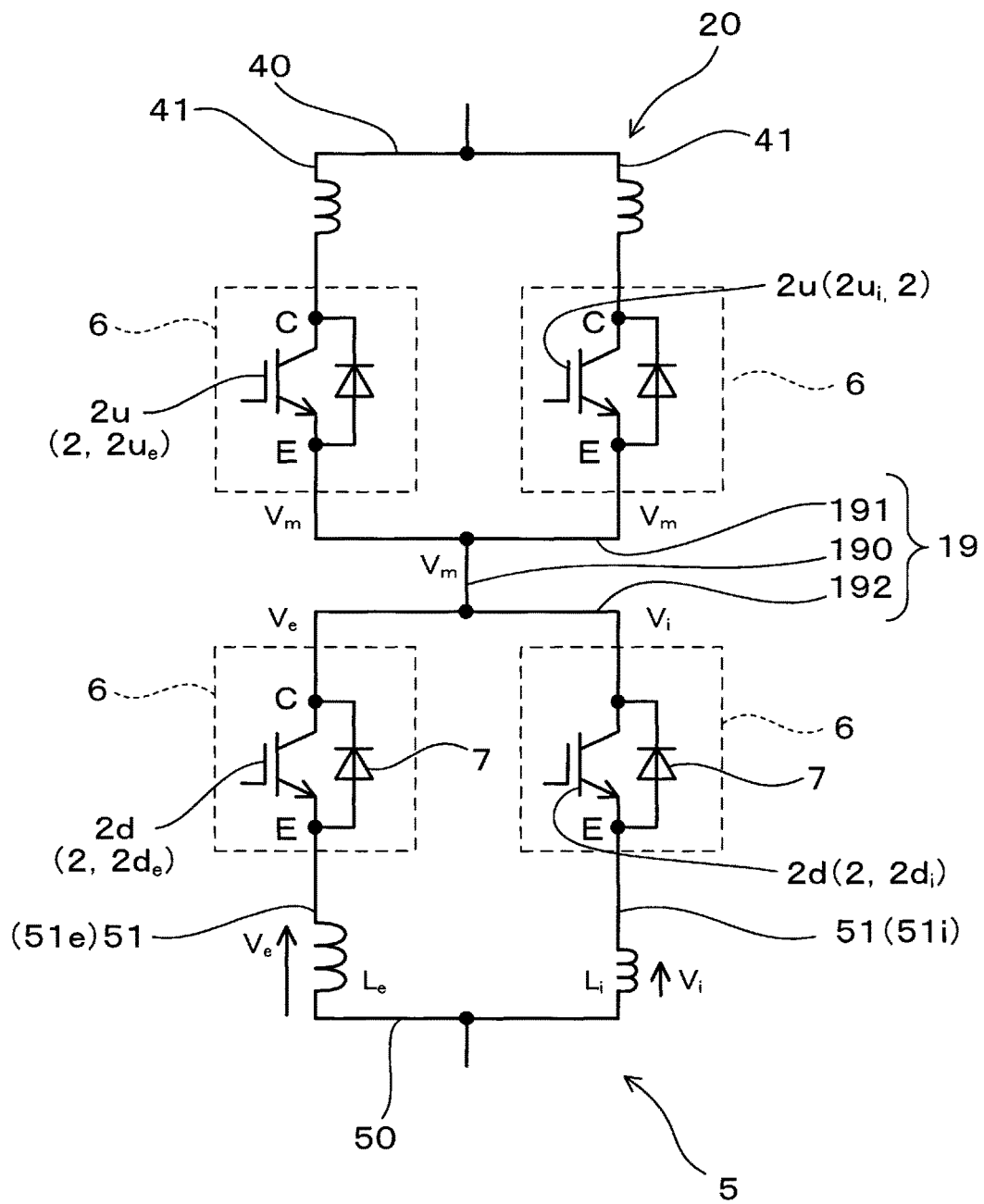
FIG. 23 is a partial circuit diagram illustrating a power converter according to a third comparative example.

In a case where only a single semiconductor device 2 is incorporated in a single semiconductor module 6 (refer to FIG. 23), a great difference between the effective inductances L of the negative side branches 51e and 51i hardly causes a great difference between the reference potentials of the two upper arm semiconductor devices $2u_e$ and $2u_i$. However, in a case where one upper arm semiconductor device 2u and one lower arm semiconductor device 2d are incorporated in a single semiconductor module 6 as in the present embodiment, a great difference between the effective inductances L of the negative side branches 51e and 51i can cause a great difference between the reference potentials of the two upper arm semiconductor devices $2u_e$ and $2u_i$. The reason is as follows. As illustrated in FIG. 23, in a case where only a single semiconductor device 2 is incorporated in a single semiconductor module 6, the emitter terminals of the upper arm semiconductor devices 2u and the collector terminals of the lower arm semiconductor devices 2d are connected by an AC bus bar 19. The AC bus bar 19 includes an upper arm 191, a lower arm 192, and a single connector 190 connecting these arms. The upper arm 191 connects the plurality of upper arm semiconductor devices 2u. The lower arm 192 connects the plurality of lower arm semiconductor devices 2d.

Suppose different induced electromotive forces $V_e$ and $V_i$ are generated in a certain moment respectively at the two negative side branches 51e and 51i due to the difference between the effective inductances L ($L_e$ and $L_i$) of the negative side branches 51e and 51i. At this time, since a forward voltage is applied to the freewheeling diodes 7, the electrical potentials of the lower arm semiconductor devices $2d_e$ and $2d_i$ are approximately $V_e$ and $V_i$, respectively. However, since the two lower arm semiconductor devices $2d_e$ and $2d_i$ are connected to the two upper arm semiconductor devices $2u_e$ and $2u_i$ via the single connector 190, the electrical potentials (namely, reference potentials) of the emitters of the two upper arm semiconductor devices $2u_e$ and $2u_i$ are the median value $V_m$ of $V_e$ and $V_i$, which means that the two reference potentials are almost equal.

Figure 22:
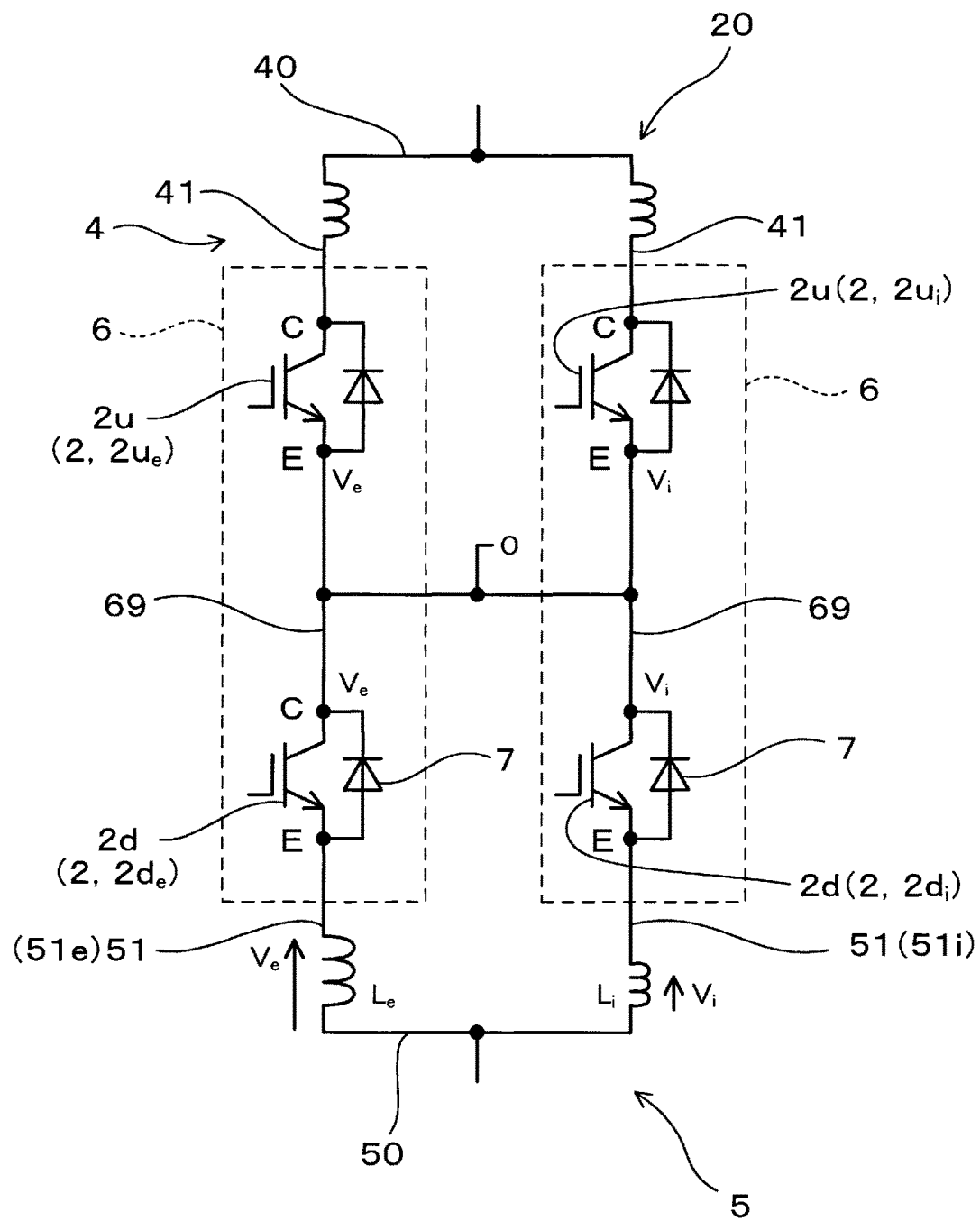
FIG. 22 is a partial circuit diagram illustrating a power converter according to a second comparative example.

In contrast, in a case where one upper arm semiconductor device 2u and one lower arm semiconductor device 2d are incorporated in a single semiconductor module 6 as illustrated in FIG. 22, a great difference between the effective inductances L of the two negative side branches 51e and 51i can cause a great difference between the reference potentials of the two upper arm semiconductor devices $2u_e$ and $2u_i$. Specifically, in this case, in each semiconductor module 6, the upper arm semiconductor device 2u and the lower arm semiconductor device 2d are individually connected by a conductive member 69 inside the semiconductor module 6. In other words, the two lower arm semiconductor devices $2d_e$ and $2d_i$ are separately connected to the upper arm semiconductor devices $2u_e$ and $2u_i$. Therefore, if different induced electromotive forces $V_e$ and $V_i$ are generated at the negative side branches 51e and 51i due to the difference between the effective inductances L ($L_e$ and $L_i$), the freewheeling diodes 7 conduct, and the electrical potentials of the emitters of the two upper arm semiconductor devices $2u_e$ and $2u_i$ have different values $V_e$ and $V_i$.

Figure 11:
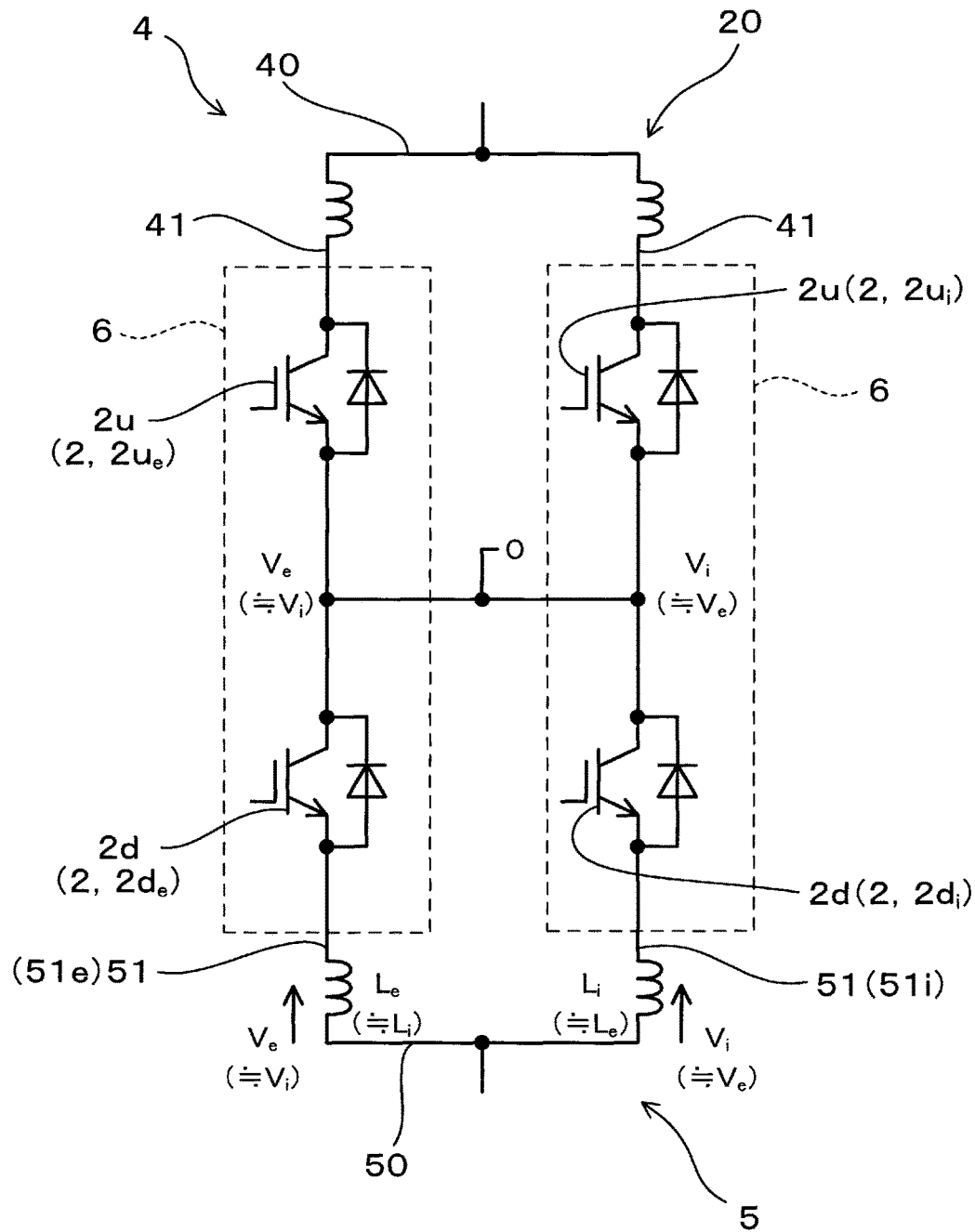
FIG. 11 is a diagram for explaining the reason why the difference between the reference potentials of upper arm semiconductor devices can be reduced even in a case where one upper arm semiconductor device and one lower arm semiconductor device are incorporated in a single semiconductor module, according to the first embodiment.

Therefore, in a case where one upper arm semiconductor device 2u and one lower arm semiconductor device 2d are incorporated in a single semiconductor module 6 as in the present embodiment, a reduction in the difference between the effective inductances L ($L_e$ and $L_i$) of the negative side branches 51e and 51i can reduce the difference between the induced electromotive forces $V_e$ and $V_i$ generated at the negative side branches 51e and 51i as illustrated in FIG. 11. Thus, the difference between the reference potentials $V_e$ and $V_i$ of the two upper arm semiconductor devices $2u_e$ and $2u_i$ can be reduced.

Next, the effects of the present embodiment will be described. In the present embodiment, as illustrated in FIG. 2, the positive side branches 41 and the negative side branches 51 are arranged alternately, and a plurality of semiconductor devices 2 that is connected to these branches and simultaneously turned on and off constitutes the semiconductor device group 20. The self-inductance of the end negative side branch 51e of the plurality of negative side branches 51 is smaller than that of the interposed negative side branch 51i.

Therefore, the difference between the reference potentials of the plurality of lower arm semiconductor devices 2d that is simultaneously turned on and off can be reduced. Specifically, since the end negative side branch 51e is not interposed between two positive side branches 41, as described above, the end negative side branch 51e is likely to have a larger mutual inductance than the interposed negative side branch 51i interposed between two positive side branches 41. In the present embodiment, the end negative side branch 51e that is likely to have a large mutual inductance is configured to have a smaller self-inductance than the interposed negative side branch 51i has. Therefore, the difference between the effective inductances L (i.e., the sum of mutual and self-inductances) of the interposed negative side branch 51i and the end negative side branch 51e can be reduced. Therefore, as illustrated in FIG. 11, induced electromotive forces generated due to the effective inductances L when current flows do not differ greatly between the interposed negative side branch 51i and the end negative side branch 51e. Thus, the difference between the reference potential of the lower arm semiconductor device $2d_i$ connected to the interposed negative side branch 51i and the reference potential of the lower arm semiconductor device $2d_e$ connected to the end negative side branch 51e can be reduced. In other words, the difference between the reference potentials of the plurality of lower arm semiconductor devices $2d_i$ and $2d_e$ that are connected to these negative side branches 51i and 51e and simultaneously turned on and off can be reduced. Therefore, it is possible to prevent the problem of local application of high voltages to the control terminals of some lower arm semiconductor devices 2d from occurring.

In the present embodiment, as illustrated in FIG. 1, the semiconductor modules 6 and the cooling pipes 11 are stacked to constitute the stacked body 10.

In this case, the positive side branches 41 connected to the positive terminals 61p of the semiconductor modules 6 and the negative side branches 51 connected to the negative terminals 61n are alternately arrayed. This configuration can form the interposed negative side branch 51i sandwiched between two positive side branches 41 connected to the upper arm semiconductor devices 2u that belong to the same semiconductor device group 20 and having a relatively small mutual inductance, and form the end negative side branch 51e that is not sandwiched between two positive side branches 41 and having a relatively large mutual inductance. Therefore, in the present embodiment, reducing the self-inductance of the end negative side branch 51e to reduce the difference between the effective parasitic inductances L of the two negative side branches 51e and 51i brings about a significant effect.

In the present embodiment, as illustrated in FIGS. 2 and 11, one upper arm semiconductor device 2u and one lower arm semiconductor device 2d are incorporated in the single semiconductor module 6.

In this case, as described above, a great difference between the effective parasitic inductances L of the two negative side branches 51e and 51i can cause a great difference between the reference potentials of the two upper arm semiconductor devices $2u_e$ and $2u_i$ (refer to FIG. 22). In the present embodiment, however, since the difference between the effective parasitic inductances L of the two negative side branches 51e and 51i can be reduced, the difference between the reference potentials of the two upper arm semiconductor devices $2u_e$ and $2u_i$ can be reduced as illustrated in FIG. 11.

In the present embodiment, as illustrated in FIG. 2, the X-directional thickness of the end negative side branch 51e is larger than the X-directional thickness of the interposed negative side branch 51i. Consequently, the self-inductance of the end negative side branch 51e is reduced.

Therefore, the self-inductance of the end negative side branch 51e can be reliably reduced, and the difference between the effective inductances of the two types of negative side branches 51i and 51e can be reliably reduced.

As described above, the present embodiment can provide a power converter capable of reducing the difference between the reference potentials of a plurality of semiconductor devices that are simultaneously turned on and off.

In the present embodiment, IGBTs are used as the semiconductor devices 2. However, the present invention is not limited to this example, but MOSFETs or bipolar transistors may be used, for example. In a case where MOSFETs are used as the semiconductor devices 2, the electrical potentials of source electrodes are regarded as reference potentials. In a case where bipolar transistors are used, the electrical potentials of emitter electrodes are regarded as reference potentials. SiC or GaN can also be used as a semiconductor material.

In the present embodiment, a single semiconductor device group 20 includes two upper arm semiconductor devices 2u that are simultaneously turned on and off and two lower arm semiconductor devices 2d that are simultaneously turned on and off. However, the present invention is not limited to this example. Specifically, a single semiconductor device group 20 may include three or more upper arm semiconductor devices 2u that are simultaneously turned on and off and three or more lower arm semiconductor devices 2d that are simultaneously turned on and off.

In the drawings for the following embodiments, reference signs identical to those used in the first embodiment represent components or the like similar to those of the first embodiment, unless otherwise specified.

Second Embodiment

Figure 12:
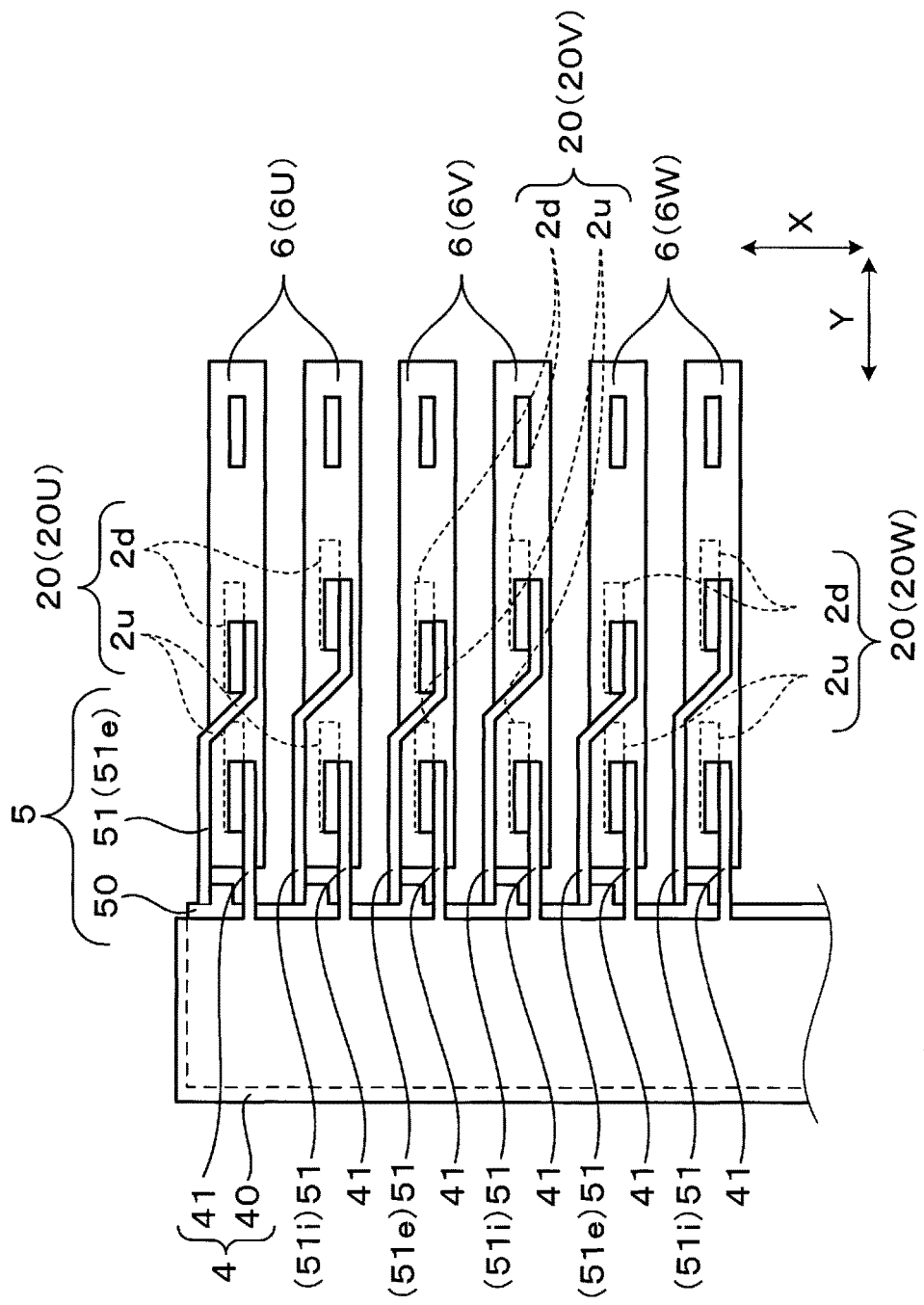
FIG. 12 is a partial cross-sectional view illustrating a power converter according to a second embodiment.

In the present embodiment, a shape of a negative bus bar 5 is changed. As illustrated in FIG. 12, in the present embodiment, the Y-directional length of the end negative side branch 51e is shorter than the Y-directional length of an interposed negative side branch 51i. Consequently, the length of the current path of the end negative side branch 51e is reduced, and the end negative side branch 51e has a smaller self-inductance than the interposed negative side branch 51i.

In contrast to the configuration of the first embodiment, the above configuration eliminates the need to form a thick end negative side branch 51e, and thus can facilitate the manufacture of the negative bus bar 5.

Other configurations and effects of the present embodiment are similar to those of the first embodiment.

Third Embodiment

Figure 13:
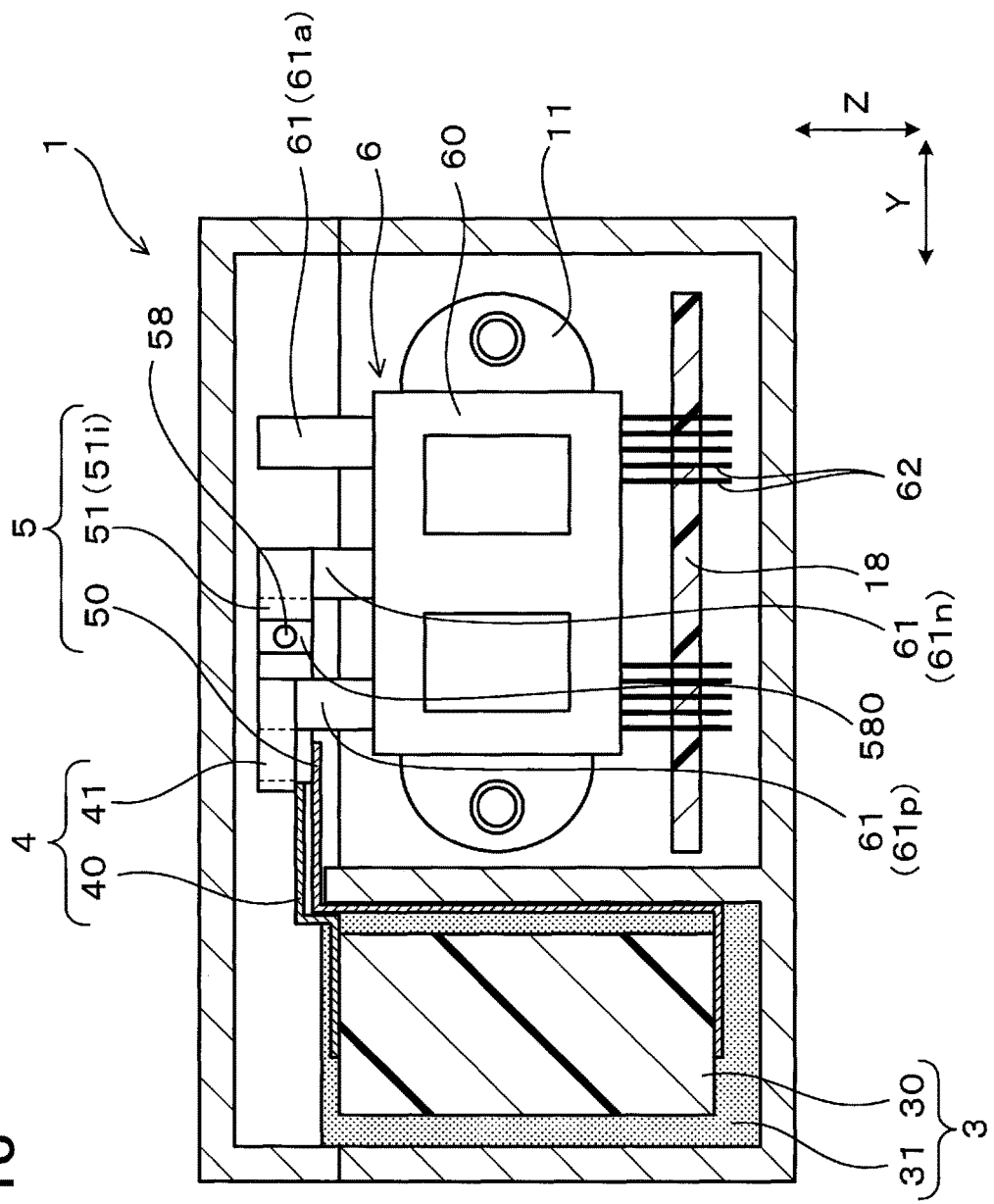
FIG. 13 is a cross-sectional view illustrating a power converter according to a third embodiment.
Figure 14:
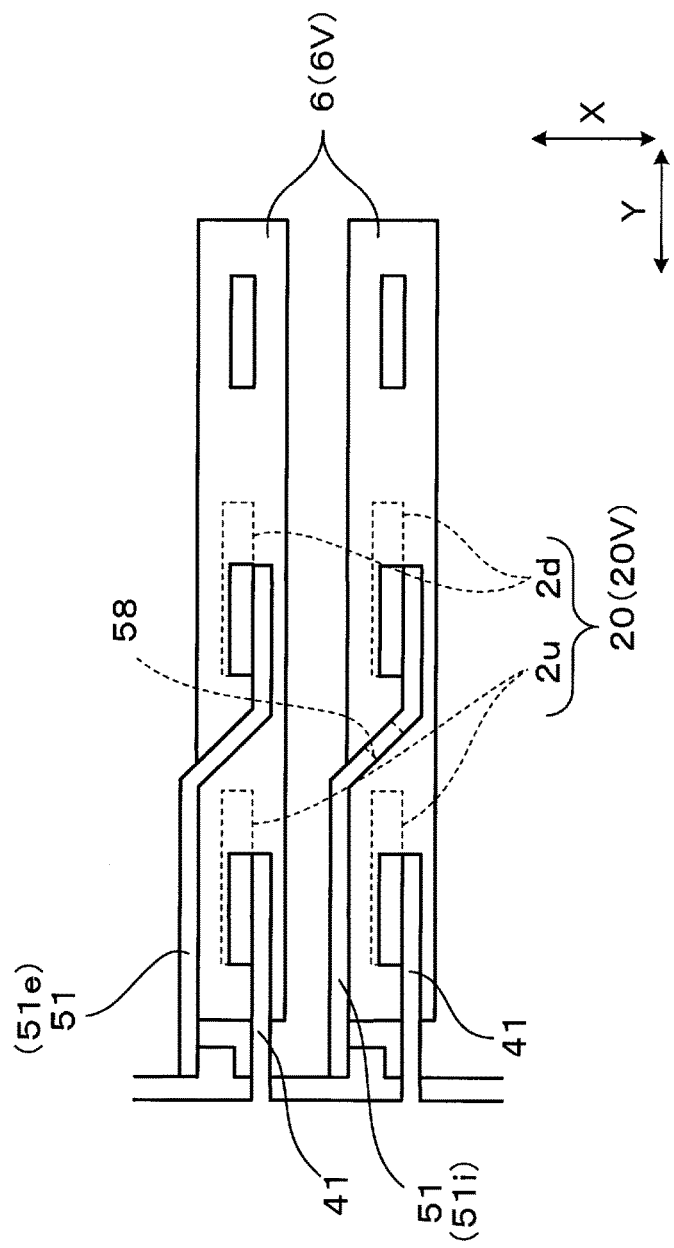
FIG. 14 is an enlarged cross-sectional view illustrating a main part of the power converter according to the third embodiment.

In the present embodiment, a shape of a negative bus bar 5 is changed. As illustrated in FIGS. 13 and 14, in the present embodiment, a through hole 58 is formed in a interposed negative side branch 51i. Consequently, a region 580 having a locally high current density is formed at the interposed negative side branch 51i to increase the self-inductance of the interposed negative side branch 51i. As a result, an end negative side branch 51e has a smaller self-inductance than the interposed negative side branch 51i.

In contrast to the configuration of the first embodiment, the above configuration eliminates the need to form a thick end negative side branch 51e, and thus can facilitate the manufacture of the negative bus bar 5.

Other configurations and effects of the present embodiment are similar to those of the first embodiment.

Fourth Embodiment

Figure 15:
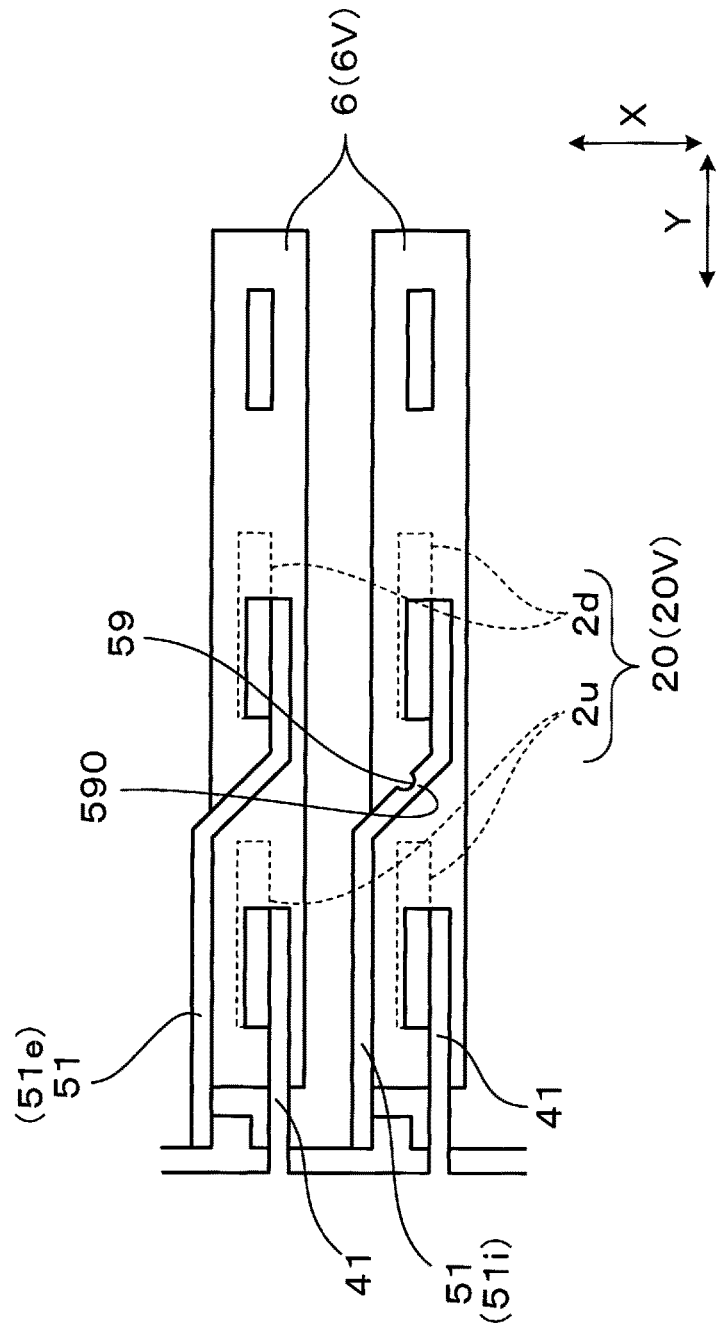
FIG. 15 is an enlarged cross-sectional view illustrating a main part of a power converter according to a fourth embodiment.

In the present embodiment, a shape of a negative bus bar 5 is changed. As illustrated in FIG. 15, in the present embodiment, a recess 59 is formed in an interposed negative side branch 51i. Consequently, a region 590 having a locally high current density is formed at the interposed negative side branch 51i to increase the self-inductance of the interposed negative side branch 51i. As a result, an end negative side branch 51e has a relatively smaller self-inductance than the interposed negative side branch 51i.

In contrast to the configuration of the first embodiment, the above configuration eliminates the need to form a thick end negative side branch 51e, and thus can facilitate the manufacture of the negative bus bar 5.

Other configurations and effects of the present embodiment are similar to those of the first embodiment.

Fifth Embodiment

Figure 16:
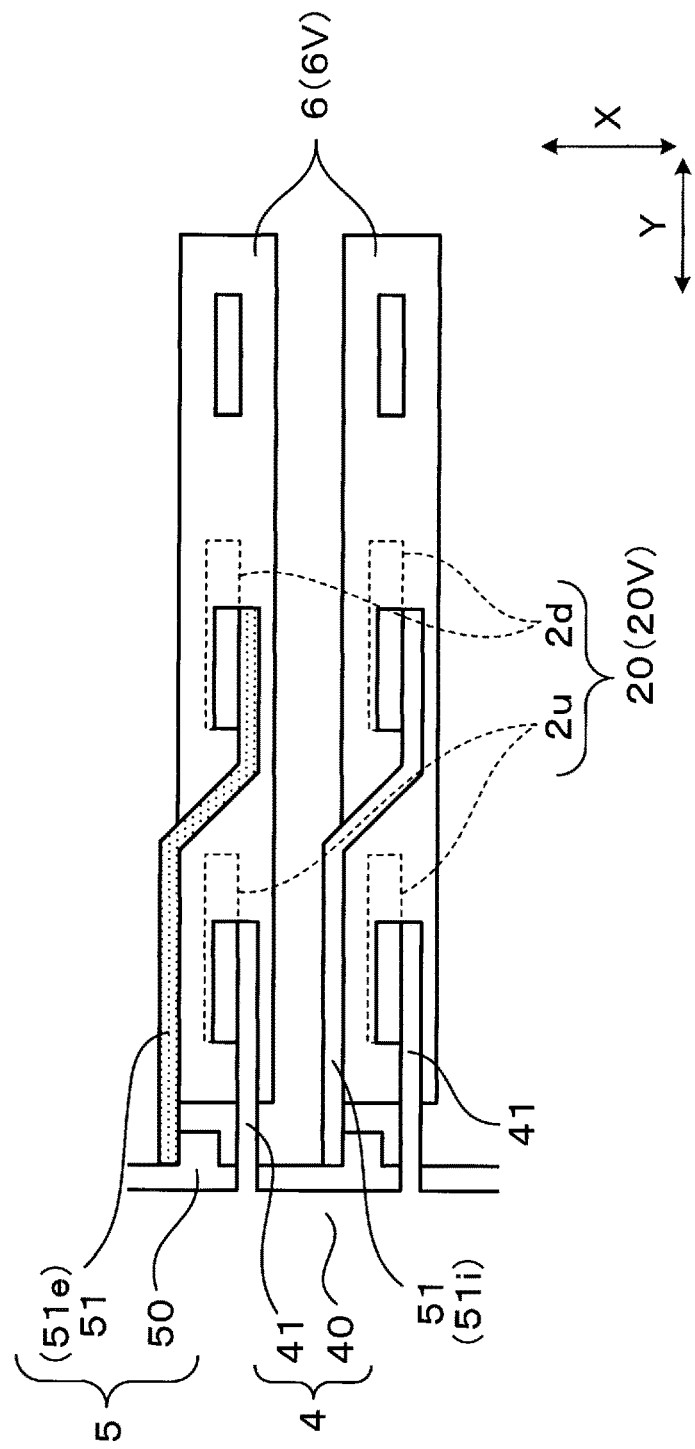
FIG. 16 is an enlarged cross-sectional view illustrating a main part of a power converter according to a fifth embodiment.

In the present embodiment, a structure of a negative bus bar 5 is changed. As illustrated in FIG. 16, in the present embodiment, an end negative side branch 51e includes a conductive material different from the material for the interposed negative side branch 51i. More specifically, in the present embodiment, the end negative side branch 51e includes a material having a smaller electrical resistivity than the material for the interposed negative side branch 51i. As a result, an end negative side branch 51e has a smaller self-inductance than the interposed negative side branch 51i.

Other configurations and effects of the present embodiment are similar to those of the first embodiment.

Sixth Embodiment

Figure 17:
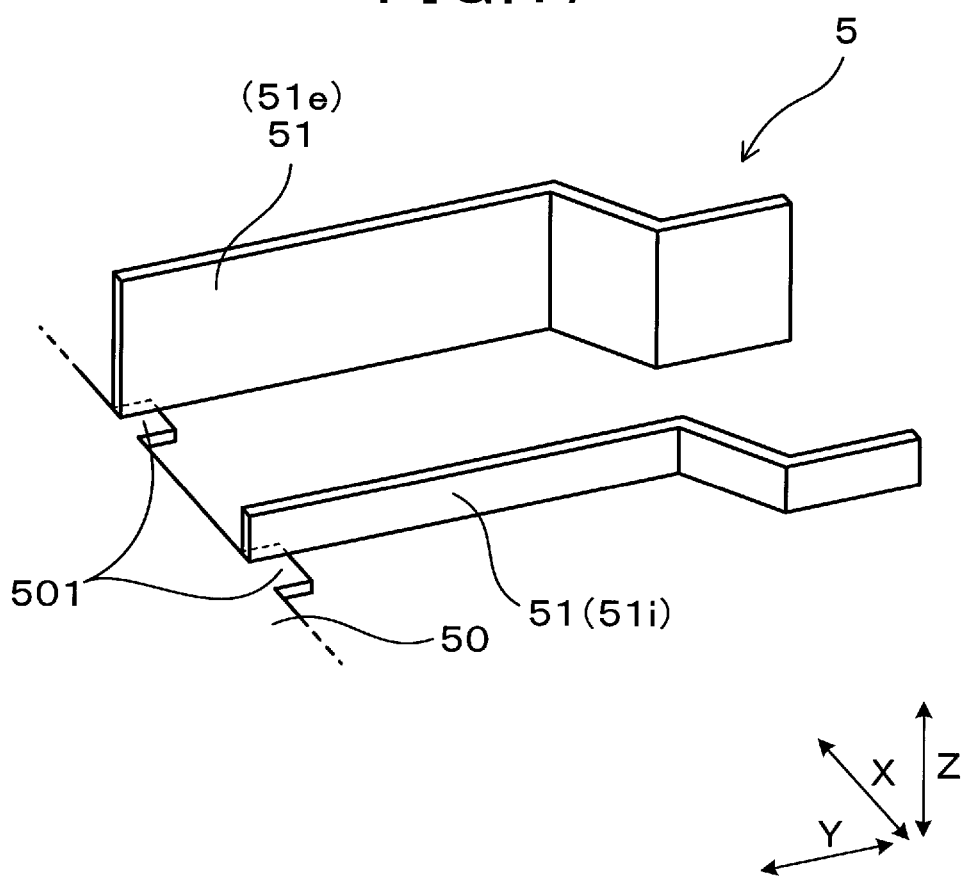
FIG. 17 is an enlarged perspective view illustrating a main part of a negative bus bar according to a sixth embodiment.

In the present embodiment, a shape of a negative bus bar 5 is changed. As illustrated in FIG. 17, in the present embodiment, an end negative side branch 51e is longer than an interposed negative side branch 51i in an orthogonal direction (hereinafter also referred to as the Z direction) orthogonal to both the X and Y directions. As a result, the end negative side branch 51e has a smaller self-inductance than the interposed negative side branch 51i.

In contrast to the configuration of the first embodiment, the above configuration eliminates the need to form a thick end negative side branch 51e, and thus can facilitate the manufacture of the negative bus bar 5.

Other configurations and effects of the present embodiment are similar to those of the first embodiment.

Seventh Embodiment

Figure 18:
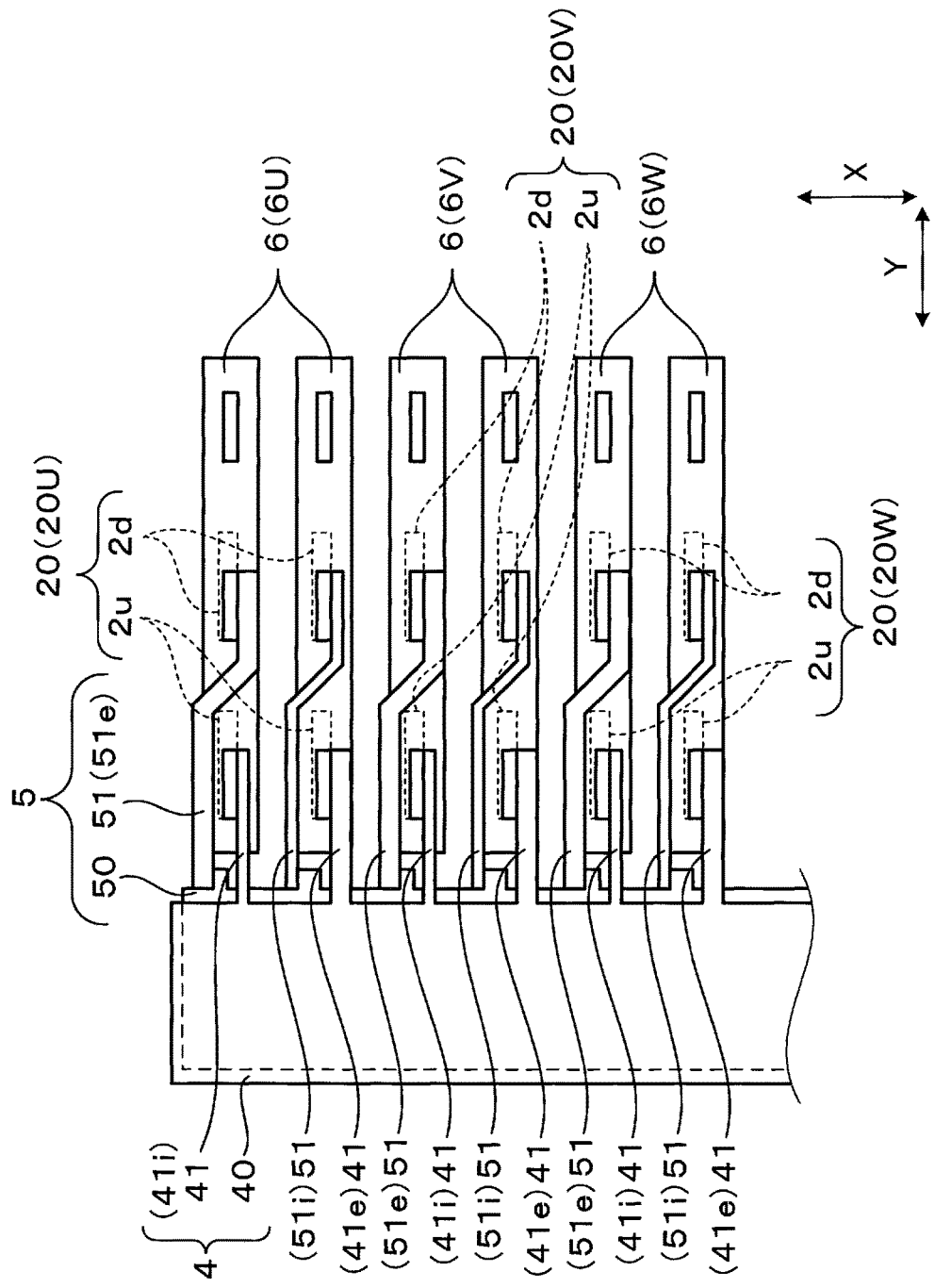
FIG. 18 is a partial cross-sectional view illustrating a power converter according to a seventh embodiment.

In the present embodiment, a shape of a positive bus bar 4 is changed. As illustrated in FIG. 18, positive side branches 41 of the positive bus bar 4 include an interposed positive side branch 41i interposed between two negative side branches 51 connected to lower arm semiconductor devices 2d that belong to the same semiconductor device group 20 as upper arm semiconductor devices 2u connected to the positive side branches 41, and include an end positive side branch 41e that is not interposed between the two negative side branches 51. In the present embodiment, an end positive side branch 41e is thicker than an interposed positive side branch 41i. As a result, the end positive side branch 41e has a smaller self-inductance than the interposed positive side branch 41i.

Since the interposed positive side branch 41i is interposed between the two negative side branches 51, the mutual inductance of the interposed positive side branch 41i is relatively small. Since the end positive side branch 41e is not interposed between the two negative side branches 51, the mutual inductance of the end positive side branch 41e is relatively large. Therefore, by reducing the self-inductance of the end positive side branch 41e having a relatively large mutual inductance, the difference between the effective inductances (i.e., the sums of mutual and self-inductances) of the interposed positive side branch 41i and the end positive side branch 41e can be reduced. Thus, the semiconductor devices 2 can be exposed to equal surges. Therefore, it is possible to prevent the problem of local application of high surges to some lower arm semiconductor devices 2 and resultant reduction in the lifetime of the semiconductor devices 2.

Other configurations and effects of the present embodiment are similar to those of the first embodiment.

In the present embodiment, a thick end positive side branch 41e is formed so that the end positive side branch 41e has a smaller self-inductance than the interposed positive side branch 41i. However, the present invention is not limited to this example. Specifically, the end positive side branch 41e may have a shorter Y-directional length than the interposed positive side branch 41i, a through hole or recess may be formed in the interposed positive side branch 41i, or the end positive side branch 41e may include a material having a smaller electrical resistivity than the material for the interposed positive side branch 41i. The end positive side branch 41e may be longer than the interposed positive side branch 41i in the Z direction.

Eighth Embodiment

Figure 19:
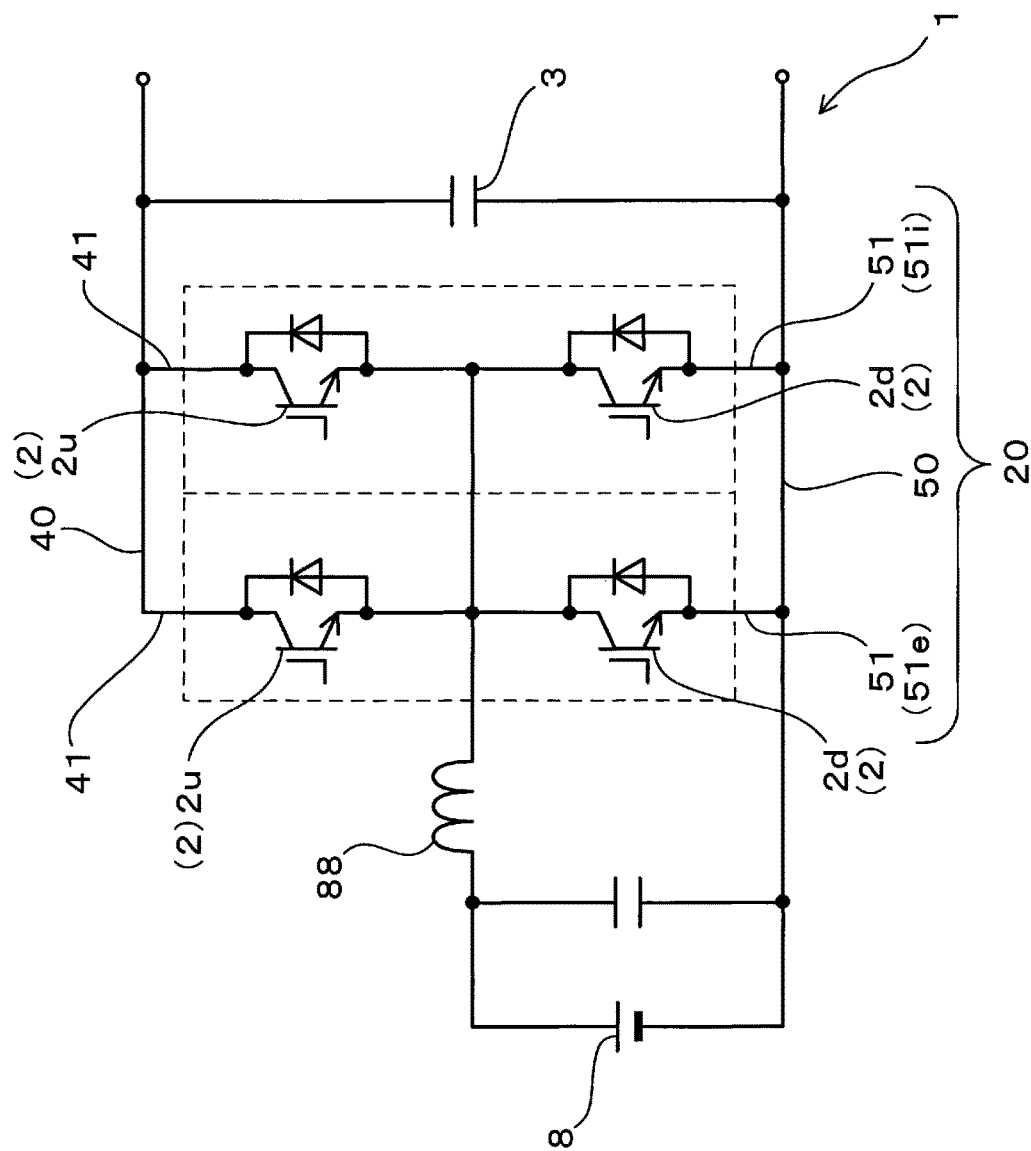
FIG. 19 is a circuit diagram illustrating a power converter according to an eighth embodiment.

In the present embodiment, the number of semiconductor device groups 20 is changed. As illustrated in FIG. 19, the present embodiment includes only a single semiconductor device group 20. The semiconductor device group 20 constitutes a boosting circuit. A reactor 88 is connected to the semiconductor device group 20. In the present embodiment, lower arm semiconductor devices 2d are turned on and off, and the voltage of a DC power source 8 is boosted using the reactor 88. The boosted voltage is then smoothed by the capacitor 3.

Figure 20:
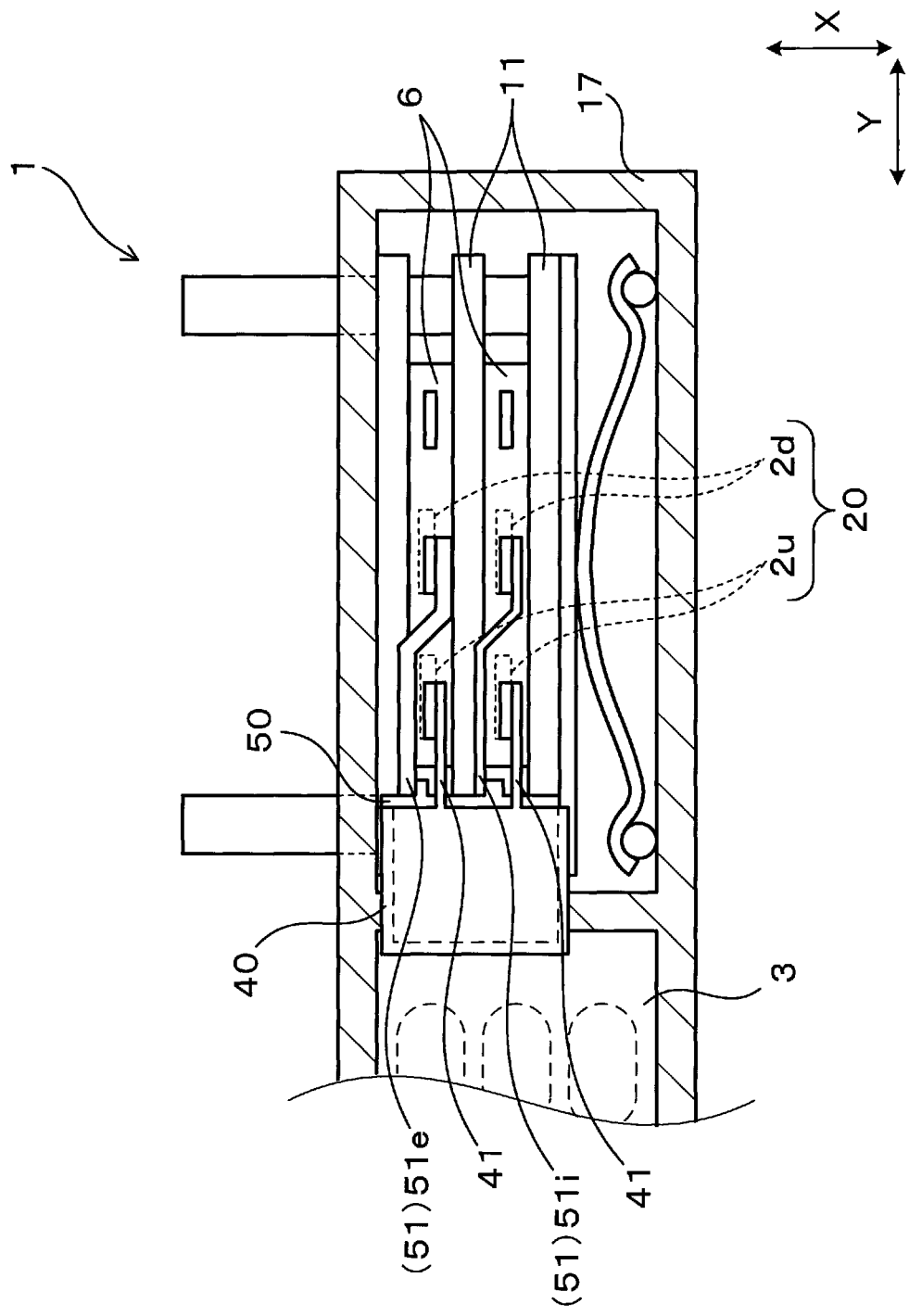
FIG. 20 is a partial cross-sectional view illustrating the power converter according to the eighth embodiment.

In the present embodiment, a difference generated between the effective parasitic inductances L of a plurality of negative side branches 51 can cause a great difference between the reference potentials of the lower arm semiconductor devices 2d as in the first embodiment. Therefore, in the present embodiment, the difference between the effective inductances L of the plurality of negative side branches 51 is reduced. Specifically, in the present embodiment, positive side branches 41 and the negative side branches 51 are arranged alternately as illustrated in FIG. 20. The negative side branches 51 include an interposed negative side branch 51i interposed between two positive side branches 41 and an end negative side branch 51e that is not interposed between two positive side branches 41. The thickness of the end negative side branch 51e is larger than the thickness of the interposed negative side branch 51i. Consequently, the self-inductance of the end negative side branch 51e is reduced, and the difference between the effective parasitic inductances of the two negative side branches 51e and 51i is reduced. As a result, the difference between the reference potentials of the lower arm semiconductor devices 2d electrically connected to the negative side branches 51e and 51i is reduced.

Other configurations and effects of the present embodiment are similar to those of the first embodiment.

The present invention is not limited to the above embodiments, but the embodiments can be combined with one another. For example, the end negative side branch 51e may be thicker than the interposed negative side branch 51i in the X direction, and the end positive side branch 41e may be longer than the interposed positive side branch 41i in the Z direction.

While the present disclosure has been described with reference to examples, it is to be understood that the present disclosure is not limited to the examples and structures. The present disclosure covers various modifications and equivalent variations. In addition to various combinations and configurations, other combinations and configurations including one, or more or fewer elements thereof are also within the spirit and scope of the present disclosure.

What is claimed is:

1. A power converter comprising:
   semiconductor devices including a plurality of upper arm semiconductor devices and a plurality of lower arm semiconductor devices connected in series;
   freewheeling diodes connected in inverse parallel with respective semiconductor devices;
   a capacitor that smooths a DC voltage;
   a positive bus bar having a positive side body electrically connected to the capacitor and a plurality of positive side branches extending from the positive side body and electrically connected to the upper arm semiconductor devices; and
   a negative bus bar having a negative side body electrically connected to the capacitor and a plurality of negative side branches extending from the negative side body and electrically connected to the lower arm semiconductor devices, wherein
   the positive side branches and the negative side branches are arranged alternately,
   two or more of the upper arm semiconductor devices that are simultaneously turned on and off and two or more of the lower arm semiconductor devices that are connected in series with the upper arm semiconductor devices and simultaneously turned on and off constitute a semiconductor device group,
   the negative side branches include an interposed negative side branch interposed between two of the positive side branches connected to the upper arm semiconductor devices that belong to the same semiconductor device group as the lower arm semiconductor devices connected to the negative side branches, and include an end negative side branch that is not interposed between two positive side branches, and
   a self-inductance of the end negative side branch is smaller than a self-inductance of the interposed negative side branch.

2. The power converter according to claim 1, wherein
   the positive side branches include an interposed positive side branch interposed between two of the negative side branches connected to the lower arm semiconductor devices that belong to the same semiconductor device group as the upper arm semiconductor devices connected to the positive side branches, and include an end positive side branch that is not interposed between the two negative side branches, and a self-inductance of the end positive side branch is smaller than a self-inductance of the interposed positive side branch.

3. The power converter according to claim 1 wherein semiconductor modules incorporating the semiconductor devices and cooling pipes that cool the semiconductor modules are stacked to constitute a stacked body.

4. The power converter according to claim 1, wherein one of the upper arm semiconductor devices and one of the lower arm semiconductor devices are incorporated in a single semiconductor module.

5. The power converter according to claim 1, wherein a thickness of the end negative side branch in an array direction of the positive side branches and the negative side branches is larger than a thickness of the interposed negative side branch in the array direction.

6. The power converter according to claim 1, wherein a length of the end negative side branch in an extending direction of the negative side branches is shorter than a length of the interposed negative side branch in the extending direction.

7. The power converter according to claim 1, wherein a through hole is formed in the interposed negative side branch.

8. The power converter according to claim 1, wherein a recess is formed in the interposed negative side branch.

9. The power converter according to claim 1, wherein the end negative side branch includes a conductive material having a smaller electrical resistivity than a material for the interposed negative side branch.

10. The power converter according to claim 1, wherein the end negative side branch is longer than the interposed negative side branch in an orthogonal direction orthogonal to both an array direction of the positive side branches and the negative side branches and an extending direction of the negative side branches.

* * * * *